(12) United States Patent
Ahmed

(10) Patent No.: US 10,260,318 B2
(45) Date of Patent: Apr. 16, 2019

(54) THREE-DIMENSIONAL INTERACTIVE WELLBORE MODEL SIMULATION SYSTEM

(71) Applicant: Saudi Arabian Oil Company, Dhahran (SA)

(72) Inventor: Imtiaz Ahmed, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 257 days.

(21) Appl. No.: 15/134,651

(22) Filed: Apr. 21, 2016

(65) Prior Publication Data

US 2016/0319642 A1    Nov. 3, 2016

Related U.S. Application Data

(60) Provisional application No. 62/153,842, filed on Apr. 28, 2015.

(51) Int. Cl.

| | |
|---|---|
| E21B 41/00 | (2006.01) |
| E21B 7/04 | (2006.01) |
| E21B 47/00 | (2012.01) |
| E21B 47/022 | (2012.01) |
| E21B 47/09 | (2012.01) |
| G01V 1/30 | (2006.01) |

(52) U.S. Cl.
CPC ........... *E21B 41/0092* (2013.01); *E21B 7/04* (2013.01); *E21B 41/0035* (2013.01); *E21B 47/00* (2013.01); *E21B 47/022* (2013.01); *E21B 47/09* (2013.01); *G01V 1/301* (2013.01)

(58) Field of Classification Search
None
See application file for complete search history.

(56) References Cited

U.S. PATENT DOCUMENTS

| | | | |
|---|---|---|---|
| 7,643,673 B2 | 1/2010 | Rohlf et al. | |
| 7,708,074 B2 * | 5/2010 | AlMubarak | E21B 34/08 137/512.1 |
| 8,214,243 B2 | 7/2012 | Graham et al. | |

(Continued)

OTHER PUBLICATIONS

I. Ahmed, A. Al-Marzooq, "E &P GIS: Integrating E & P Data and Applications" pp. 1-10, 2014.*

(Continued)

*Primary Examiner* — Kibrom K Gebresilassie
(74) *Attorney, Agent, or Firm* — Bracewell LLP; Constance G. Rhebergen; Christopher L. Drymalla

(57) ABSTRACT

Provided in some embodiments are systems and methods for simulating a well. Embodiments include, for each lateral of a well, obtaining wellbore directional survey data identifying a path of the lateral, generating (using the wellbore directional survey data) a geographic information system (GIS) virtual wellbore path, obtaining wellbore tubing, perforation and casing data for the lateral. Generating (using the wellbore tubing and perforation data) a tubing extensible three dimensional (X3D) file including data corresponding to X3D virtual tubing path. Generating (using the wellbore casing data) a casing X3D file including data corresponding to an X3D virtual casing path for the lateral. Generating a well X3D file for the well (including links to the tubing and casing X3D files) that can be provided to an X3D application of a remote computing device for generating a 3D simulation of the well.

17 Claims, 9 Drawing Sheets

(56) References Cited

U.S. PATENT DOCUMENTS

| | | | | |
|---|---|---|---|---|
| 9,091,140 | B1* | 7/2015 | Selman | E21B 7/04 |
| 9,097,096 | B1* | 8/2015 | Selman | E21B 44/00 |
| 2006/0176310 | A1* | 8/2006 | Arnaud | G06T 11/40 |
| | | | | 345/582 |
| 2008/0082549 | A1 | 4/2008 | Baker et al. | |
| 2009/0125367 | A1 | 5/2009 | Brink et al. | |
| 2010/0045662 | A1 | 2/2010 | Boothroyd et al. | |
| 2010/0060652 | A1 | 3/2010 | Karlsson et al. | |
| 2011/0100712 | A1* | 5/2011 | Poedjono | E21B 47/02208 |
| | | | | 175/45 |
| 2013/0035863 | A1* | 2/2013 | Selman | E21B 43/26 |
| | | | | 702/9 |
| 2013/0238290 | A1 | 9/2013 | Angevine et al. | |
| 2014/0025413 | A1 | 1/2014 | Yeager | |
| 2016/0247316 | A1* | 8/2016 | Whalley | E21B 47/0002 |

OTHER PUBLICATIONS

International Search Report and Written Opinion for related PCT application PCT/US2016/028557 dated Aug. 2, 2016.

Modesto et al., "Bridging IMO e-Navigation Policy and Offshore Oil and Gas Operations through Geospatial Standards", TRANSNAV, 2016, pp. 49-55, vol. 10, No. 10, www.transnav.eu.

Nooraldeen et al., "Working With the Geodatabase Technology to Optimize the Data in the Bahrain Field", SPE Middle East Health Safety Security and Environment Conference and Exhibition, 2012, pp. 1-6, Society of Petroleum Engineers.

Soni et al., "3-Dimensional Wells and Tunnels for Finite Element Grids", Numerical Grid Generation in Computational Fluid Dynamics and Related Fields , 1996, pp. 1-12.

Ahmed, et al., "E&P GIS: Integrating E&P Data and Applications" available as of Sep. 19, 2014 at the website: http://www.saudigis.org/fckfiles/file/saudigisarchive/4thgis/papers/3_adilmarzooq_ksa.pdf; pp. 1-10.

TIBCO "Integrating Subsurface and GIS Workflows" OpenSpirit Group, TIBCO Software Inc., Apr. 2011, available as of Sep. 19, 2014 at the website: http://www.tibco.com/multimedia/brochure-tibco-openspirit-gis-solutions_tcm8-16176.pdf; pp. 1-6.

Guo, et al., "Three-dimentional Simulation Application of the Oil-Well Trajectory Based on GIS and X3D" Goematics & Spatial Information Technology, vol. 36, Supp. Aug. 2013, pp. 179-185; English translation follows original article.

3D Wellbore Trajectory Model 1, available as of Sep. 19, 2014 at the website: http://www.arcgis.com/home/item.html?id=be8f94cc258c407fb2d58ff6fab8b9c2; 1 page.

* cited by examiner

THREE-DIMENSIONAL INTERACTIVE WELLBORE MODEL SIMULATION SYSTEM

CROSS-REFERENCE TO RELATED APPLICATION

This application claims the benefit of and priority to U.S. Provisional Patent Application No. 62/153,842, filed Apr. 28, 2015 and titled "METHODS TO GENERATE A WELLBORE FILE DIRECTORY AND SIMULATE THREE-DIMENSIONAL INTERACTIVE WELLBORE MODELS USING GEOGRAPHIC INFORMATION SYSTEM ANALYTICAL FUNCTIONS", which is hereby incorporated by reference in its entirety.

FIELD OF INVENTION

The present invention relates generally to oil and gas exploration, and more particularly to three dimensional interactive wellbore model simulation systems.

BACKGROUND OF THE INVENTION

A petroleum (or oil and gas) reservoir is a subsurface pool of hydrocarbons trapped in subsurface porous or fractured rock formations. Oil and gas wells are often drilled into these subsurface reservoirs to extract the trapped hydrocarbons. These wells generally include a wellbore that is drilled into the reservoir to provide a path to access the hydrocarbons.

It is often desirable to model (or map) subsurface wellbores. Three-dimensional models can include visualizations of the wellbore that provide viewers with an intuitive sense of wellbore completion and trajectory information that is not readily conveyed through tabular or other forms of data. This can include information relating to the subsurface path of the wellbore, and various characteristics of the wellbore along the path. Such models can be useful, for example, to enable engineers and other users to view and analyze wellbore completion and trajectory information in the form of interactive three-dimensional models.

SUMMARY OF THE INVENTION

Applicant has further recognized that currently available three-dimensional models of wellbores do not provide for simultaneously viewing and analyzing wellbore tubing information and casing information, much less viewing of wellbore trajectory, tubing, casing and perforation information simultaneously in the same interactive three-dimensional model. Applicant has also recognized that, while it may be a goal of generating such simulations to provide a user with more information regarding the wellbore, information can actually be lost in creating the three-dimensional model. For example, other attempts to simulate three-dimensional models focus on an innermost layer of the wellbore (e.g., a wellbore or tubing path), effectively providing a viewer with well trajectory information and nothing else. Moreover, Applicant has recognized that, even for the information that can be presented, current interactive three-dimensional simulations of wellbore data can require processor-intensive software to operate, further limiting the ability to present useful well information. In a similar regard, the simulation software may need to be compatible with, and installed on, each viewing device, to provide for viewing the simulations. Thus, field engineers that do not have a device that is powerful enough to run the simulation, or do not have a device with compatible simulation software, for example, may be unable to view and analyze interactive three-dimensional simulations of wellbore data. Unfortunately, for an organization with a large number of employees that rely on these types of simulations, the compatibility and availability issues can create significant burdens and costs to ensure that employees have the proper devices and software to view the simulations. Having recognized these and other problems, Applicant has developed a novel three dimensional interactive wellbore model simulation system, capable of executing computer-implemented methods to generate a wellbore file directory and simulate three-dimensional interactive wellbore models.

In some embodiments, provided is a well simulation system. The system including one or more processors and non-transitory compute readable storage medium including program instructions stored thereon that are executable by the one or more processors to perform the following operations: select a well including a wellbore having one or more laterals; for each of the one or more laterals of the well: obtain wellbore directional survey data for the lateral, the wellbore directional survey data identifying a path of the lateral; generating, using the wellbore directional survey data for the lateral, a geographic information system (GIS) virtual wellbore path feature, the GIS virtual wellbore path feature including one or more multi-point GIS linear features corresponding to the path of the lateral; obtain wellbore tubing data for the lateral, the wellbore tubing data for the lateral identifying size and location of one or more sections of wellbore tubing in the lateral; obtain wellbore perforation data for the lateral, wellbore perforation data for the lateral identifying size and location of one or more sections of perforations in the lateral; generate, using the wellbore tubing data and the wellbore perforation data for the lateral, an extensible three dimensional (X3D) virtual tubing path for the lateral, the X3D virtual tubing path for the lateral including: one or more tubing X3D cross-sections corresponding to the size and location of the one or more sections of wellbore tubing in the lateral, and one or more perforation X3D cross-sections corresponding to the size and location of the one or more sections of wellbore perforations in the lateral; generate a tubing X3D file including data corresponding to the X3D virtual tubing path for the lateral; obtain wellbore casing data for the lateral, wellbore casing data for the lateral identifying size and location of one or more sections of wellbore casing in the lateral; generate using the wellbore casing data for the lateral, an X3D virtual casing path for the lateral, the X3D virtual casing path for the lateral including an X3D element corresponding to the size and location of the one or more sections of wellbore casing in the lateral; and generate a casing X3D file including data corresponding to the X3D virtual casing path for the lateral; and generate a well X3D file for the well, the well X3D file including: links to the tubing X3D files (e.g., one per lateral); and links to the casing X3D files (e.g., one per lateral). The well X3D file is adapted to be used by an X3D enabled application of one or more remote computing devices for use in generating a 3D simulation of the well for display on the one or more remote computing devices.

In certain embodiments, the operations further include: providing, via a network, the well X3D file to an X3D enabled application of the one or more remote computing devices for use in generating a 3D simulation of the well for display on the one or more remote computing devices, the 3D simulation of the well including display of a 3D virtual tubing path corresponding to the X3D virtual tubing path that is generated using the links to the tubing X3D file and a 3D virtual casing path corresponding to the X3D virtual casing path that is generated using the links to the casing X3D file.

In certain embodiments, generating the X3D virtual tubing path includes: performing an extrusion operation for each of the one or more sections of wellbore tubing in the lateral to generate the tubing X3D cross-sections corresponding to the size and the location of the one or more sections of wellbore tubing in the lateral; and performing an extrusion operation for each of the one or more sections of wellbore perforations in the lateral to generate the perforation X3D cross-sections corresponding to the size and the location of the one or more sections of wellbore tubing in the lateral.

In certain embodiments, the wellbore tubing data for the lateral includes, for each of the one or more sections of wellbore tubing in the lateral: a tubing from-measured depth value; a tubing to-measured depth value; and a tubing size. In such an embodiment, performing an extrusion operation for each of the one or more sections of wellbore tubing in the lateral to generate the tubing X3D cross-sections corresponding to the size and the location of the one or more sections of wellbore tubing in the lateral includes, for each of the one or more sections of wellbore tubing, performing an extrusion operation between the tubing from-measured depth value for the section of wellbore tubing and the tubing to-measured depth value of the section of wellbore tubing, the extrusion having a size corresponding to the tubing size for the section of wellbore tubing. Further, the wellbore perforation data for the lateral includes, for each of the one or more sections of wellbore perforations in the lateral: a perforation from-measured depth value; a perforation to-measured depth value; and a perforation size. In such an embodiment, performing an extrusion operation for each of the one or more sections of wellbore perforations in the lateral to generate the one or more perforation X3D cross-sections corresponding to the size and the location of the one or more section of wellbore perforations in the lateral includes, for each of the one or more sections of wellbore perforations, performing an extrusion operation between the perforation from-measured depth value for the section of wellbore perforations and the perforation to-measured depth value of the section of wellbore perforations, the extrusion having features indicative of the perforation size for the section of wellbore perforations.

In certain embodiments, generating X3D virtual casing path includes: generating a seamless half-section GIS multi-patch cylinder object for each of the one or more sections of wellbore casing in the lateral; and converting the seamless half-section GIS multi-patch cylinder object for each of the one or more sections of wellbore casing in the lateral to an X3D IndexedTriangleStripSet element. In some embodiments, the wellbore casing data for the lateral includes, for each of the one or more sections of wellbore casing in the lateral: a casing from-measured depth value; a casing to-measured depth value; and a casing size. In such an embodiment, generating a seamless half-section GIS multi-patch cylinder object for each of the one or more sections of wellbore casing in the lateral includes generating for each of the one or more sections of wellbore casing, a seamless half-section GIS multi-patch cylinder object between the casing from-measured depth value for the section of wellbore casing and the casing to-measured depth value of the section of wellbore casing, the seamless half-section GIS multi-patch cylinder object having a size corresponding to the casing size for the section of wellbore casing.

In certain embodiments, the well X3D file includes links to X, Y and Z X3D grids for use in generating display of a 3D grid in the 3D simulation of the well. In certain embodiments, the links to the tubing X3D file include a URL link to the tubing X3D file for each lateral, and the links to the casing X3D file include a URL link to the casing X3D file for each lateral.

In certain embodiments, the system further includes: a database server storing wellbore data. The wellbore data including: the wellbore directional survey data for the one or more laterals of the well; the wellbore tubing data for the one or more laterals of the well; the wellbore perforation data for the one or more laterals of the well; and the wellbore casing data for the one or more laterals of the well, and the wellbore tubing data, the wellbore perforation data and the wellbore casing data for the one or more laterals of the well are obtained from the database server. In certain embodiments, a web server communicatively coupled to one or more remote computing devices via a network, and includes a wellbore file directory including: the well X3D file for the well; the tubing X3D file(s) for the well (e.g., one for each lateral); and the casing X3D file(s) for the well (e.g., one for each lateral), and the wellbore file directory is accessible by an X3D enabled application of the one or more remote computing devices via a network.

In certain embodiments, the system further includes at least one of the one or more remote computing devices, and the at least of the one or more remote computing devices includes an Internet browser application and an X3D plug-in for the Internet browser application. The at least of the one or more remote computing devices is adapted to: access the well X3D file for the well; access, via the links to the tubing X3D files of the well X3D file, the data corresponding to the X3D virtual tubing path for the lateral of the tubing X3D file for the well; access, via the links to the casing X3D files of the well X3D file, the data corresponding to the X3D virtual casing path for the lateral of the casing X3D file for the well; and render the data corresponding to the X3D virtual tubing path for the lateral and the data corresponding to the X3D virtual casing path for the lateral to generate a display of a 3D model simulating the well on a display of the at least one of the one or more remote computing devices.

Provided in some embodiments is a method of simulating a well. The method includes: selecting a well including a wellbore having one or more laterals; for each of the one or more laterals of the well: obtaining wellbore directional survey data for the lateral, the wellbore directional survey data identifying a path of the lateral; generating, using the wellbore directional survey data for the lateral, a GIS virtual wellbore path feature, the GIS virtual wellbore path feature including one or more multi-point GIS linear features corresponding to the path of the lateral; obtaining wellbore tubing data for the lateral, the wellbore tubing data for the lateral identifying size and location of one or more sections of wellbore tubing in the lateral; obtaining wellbore perforation data for the lateral, wellbore perforation data for the lateral identifying size and location of one or more sections of perforations in the lateral; generating, using the wellbore tubing data and the wellbore perforation data for the lateral, an X3D virtual tubing path for the lateral, the X3D virtual tubing path for the lateral including: one or more tubing X3D cross-sections corresponding to the size and location of the one or more sections of wellbore tubing in the lateral; and one or more perforation X3D cross-sections corresponding to the size and location of the one or more sections of wellbore perforations in the lateral; generating a tubing X3D file including data corresponding to the X3D virtual tubing path for the lateral; obtaining wellbore casing data for the lateral, wellbore casing data for the lateral identifying size and location of one or more sections of wellbore casing in the lateral; generating using the wellbore casing data for the lateral, an X3D virtual casing path for the lateral, the X3D virtual casing path for the lateral including an X3D element corresponding to the size and location of the one or more sections of wellbore casing in the lateral; and generating a casing X3D file including data corresponding to the X3D virtual casing path for the lateral; and generating a well X3D file for the well, the well X3D file including: links to the tubing X3D files (e.g., one per lateral); and links to the casing X3D files (e.g., one per lateral). The well X3D file is adapted to be used by an X3D enabled application of one or more remote computing devices for use in generating a 3D simulation of the well for display on the one or more remote computing devices.

In certain embodiments, the method further includes: providing, via a network, the well X3D file to an X3D enabled application of the one or more remote computing devices for use in generating a 3D simulation of the well for display on the one or more remote computing devices, the 3D simulation of the well including display of a 3D virtual tubing path corresponding to the X3D virtual tubing path that is generated using the links to the tubing X3D files and a 3D virtual casing path corresponding to the X3D virtual casing path that is generated using the links to the casing X3D files.

In certain embodiments, generating the X3D virtual tubing path includes: performing an extrusion operation for each of the one or more sections of wellbore tubing in the lateral to generate the tubing X3D cross-sections corresponding to the size and the location of the one or more sections of wellbore tubing in the lateral; and performing an extrusion operation for each of the one or more sections of wellbore perforations in the lateral to generate the perforation X3D cross-sections corresponding to the size and the location of the one or more sections of wellbore tubing in the lateral.

In certain embodiments, the wellbore tubing data for the lateral includes, for each of the one or more sections of wellbore tubing in the lateral: a tubing from-measured depth value; a tubing to-measured depth value; and a tubing size. In such an embodiment, performing an extrusion operation for each of the one or more sections of wellbore tubing in the lateral to generate the tubing X3D cross-sections corresponding to the size and the location of the one or more sections of wellbore tubing in the lateral includes, for each of the one or more sections of wellbore tubing, performing an extrusion operation between the tubing from-measured depth value for the section of wellbore tubing and the tubing to-measured depth value of the section of wellbore tubing, the extrusion having a size corresponding to the tubing size for the section of wellbore tubing. Further, the wellbore perforation data for the lateral includes, for each of the one or more sections of wellbore perforations in the lateral: a perforation from-measured depth value; a perforation to-measured depth value; and a perforation size. In such an embodiment, performing an extrusion operation for each of the one or more sections of wellbore perforations in the lateral to generate the one or more perforation X3D cross-sections corresponding to the size and the location of the one or more section of wellbore perforations in the lateral includes, for each of the one or more sections of wellbore perforations, performing an extrusion operation between the perforation from-measured depth value for the section of wellbore perforations and the perforation to-measured depth value of the section of wellbore perforations, the extrusion having features indicative of the perforation size for the section of wellbore perforations.

In certain embodiments, generating X3D virtual casing path includes: generating a seamless half-section GIS multi-patch cylinder object for each of the one or more sections of wellbore casing in the lateral; and converting the seamless half-section GIS multi-patch cylinder object for each of the one or more sections of wellbore casing in the lateral to an X3D IndexedTriangleStripSet element. In some embodiments, the wellbore casing data for the lateral includes, for each of the one or more sections of wellbore casing in the lateral: a casing from-measured depth value; a casing to-measured depth value; and a casing size. In such an embodiment, generating a seamless half-section GIS multi-patch cylinder object for each of the one or more sections of wellbore casing in the lateral includes generating for each of the one or more sections of wellbore casing, a seamless half-section GIS multi-patch cylinder object between the casing from-measured depth value for the section of wellbore casing and the casing to-measured depth value of the section of wellbore casing, the seamless half-section GIS multi-patch cylinder object having a size corresponding to the casing size for the section of wellbore casing.

In certain embodiments, the well X3D file includes links to X, Y and Z X3D grids for use in generating display of a 3D grid in the 3D simulation of the well. In certain embodiments, the links to the tubing X3D file include a URL link to the tubing X3D file (e.g., one per lateral), and the links to the casing X3D file include a URL link to the casing X3D file (e.g., one per lateral).

In certain embodiments, the method includes: storing wellbore data and generating a wellbore file directory. The wellbore data including: the wellbore directional survey data for the one or more laterals of the well; the wellbore tubing data for the one or more laterals of the well; the wellbore perforation data for the one or more laterals of the well; and the wellbore casing data for the one or more laterals of the well, wherein the wellbore tubing data, the wellbore perforation data and the wellbore casing data for the one or more laterals of the well are obtained from the database server, and generating a wellbore file directory including: the well X3D file for the well; the tubing X3D files for the well laterals; and the casing X3D files for the well laterals. The wellbore file directory is accessible by an X3D enabled application of the one or more remote computing devices via a network.

In certain embodiments, the method includes: accessing the well X3D file for the well; accessing, via the links to the tubing X3D files of the well X3D file, the data corresponding to the X3D virtual tubing path for the lateral of the tubing X3D file for the well; accessing, via the links to the casing X3D files of the well X3D file, the data corresponding to the X3D virtual casing path for the lateral of the casing X3D file for the well; and rendering the data corresponding to the X3D virtual tubing path for the lateral and the data corresponding to the X3D virtual casing path for the lateral to generate a display of a 3D model simulating the well on a display of at least one of the one or more remote computing devices.

Provided in some embodiments is a method to generate a wellbore file directory and simulate three-dimensional interactive wellbore models. The method may include: selecting a well; selecting a lateral associated with the selected well; reading wellbore directional survey data associated with the selected lateral, the wellbore directional survey data including the following for each of a plurality of vertices associated with the selected lateral: x-coordinate, y-coordinate, true vertical depth, and measured depth; creating one or more multi-point GIS linear features along a GIS virtual wellbore path, the GIS virtual wellbore path approximating an actual wellbore path for the selected lateral, each multi-point GIS linear feature including one or more of the plurality of vertices; opening a tubing X3D file; setting scene appearance tags for the selected lateral; reading wellbore tubing data for the selected lateral, the wellbore tubing data including the following for a wellbore tubing: tubing from-measured depth value, tubing to-measured depth value, and tubing size; reading wellbore perforation data for the selected lateral, the wellbore perforation data including the following for a wellbore perforation: perforation from-measured depth value, perforation to-measured depth value, and perforation size; identifying tubing sections including sections of the one or more GIS linear features between the tubing from-measured depth value and the tubing to-measured depth value for the wellbore tubing; identifying perforation sections including sections of the one or more GIS linear features between the perforation from-measured depth value and the perforation to-measured depth value for the wellbore perforation; constructing X3D cross-sections along the tubing sections, thereby to generate a virtual tubing path; constructing X3D cross-sections along the perforation sections, thereby to generate a virtual perforation path; determining whether the wellbore tubing data and the wellbore perforation data correspond to a final wellbore tubing and wellbore perforation record; if the wellbore tubing data and the wellbore perforation data do not correspond to the final wellbore tubing and wellbore perforation record, repeating the reading, two identifying, and two constructing steps for each additional wellbore tubing and wellbore perforation record; if the wellbore tubing data and the wellbore perforation data correspond to the final wellbore tubing and wellbore perforation record, setting animation tags for the tubing X3D file; and closing the tubing X3D file, thereby to create a first file of a wellbore file directory.

In certain embodiments, the method includes: opening a casing X3D file for the selected lateral; reading wellbore casing data for the selected lateral, the wellbore casing data including: casing from-measured depth, casing to-measured depth, and casing size; identifying casing sections including sections of the one or more GIS linear features between the casing from-measured depth value and the casing to-measured depth value for the wellbore casing; constructing a half-section GIS multi-patch cylinder along the casing sections; constructing an X3D Index-Triangle-StripSet element from the half-section GIS multi-patch cylinder; adding X3D casing size anchored text elements for the casing sections; determining whether the wellbore casing data corresponds to a final wellbore casing record; if the wellbore casing data does not correspond to a final wellbore casing record, repeating the reading, identifying, two constructing, and adding steps for each additional wellbore casing record; if the wellbore casing data corresponds to the final wellbore casing record, setting animation tags for the casing X3D file; closing the X3D casing file, thereby to create a second file of the wellbore file directory; determining whether the selected lateral is a final lateral associated with the selected well; and if the selected lateral is not the final lateral associated with the selected well, selecting an additional lateral thereby to create additional tubing X3D files and additional casing X3D files for each lateral associated with the selected well.

In certain embodiments, the method includes: if the selected lateral is the final lateral associated with the selected well, opening a well X3D file for the selected well; setting scene viewpoint animations for the well X3D file; creating uniform resource locator (URL) links to the tubing X3D files and the casing X3D files associated with the selected well; creating URL links to X, Y, Z X3D grids; closing the well X3D file for the selected well; linking the well X3D file for the selected well to a well layer GIS web service; determining whether the selected well is a final well for which wellbore directional survey data exists; and if the selected well is not the final well for which wellbore directional survey data exists, selecting an additional well thereby to create additional well X3D files for each well for which wellbore directional survey data exists.

In certain embodiments, the method includes: accessing the well X3D file for the selected well from a remote computing device, the remote computing device including an Internet browser, the Internet browser including an X3D plugin, thereby to simulate a three-dimensional interactive wellbore model on the remote computing device.

Provided in some embodiments is a non-transitory computer readable medium including program instructions stored thereon for simulating a well. In such embodiments, the program instructions are executable by one or more computer processors to perform the operations of the methods described above.

Figure 1:
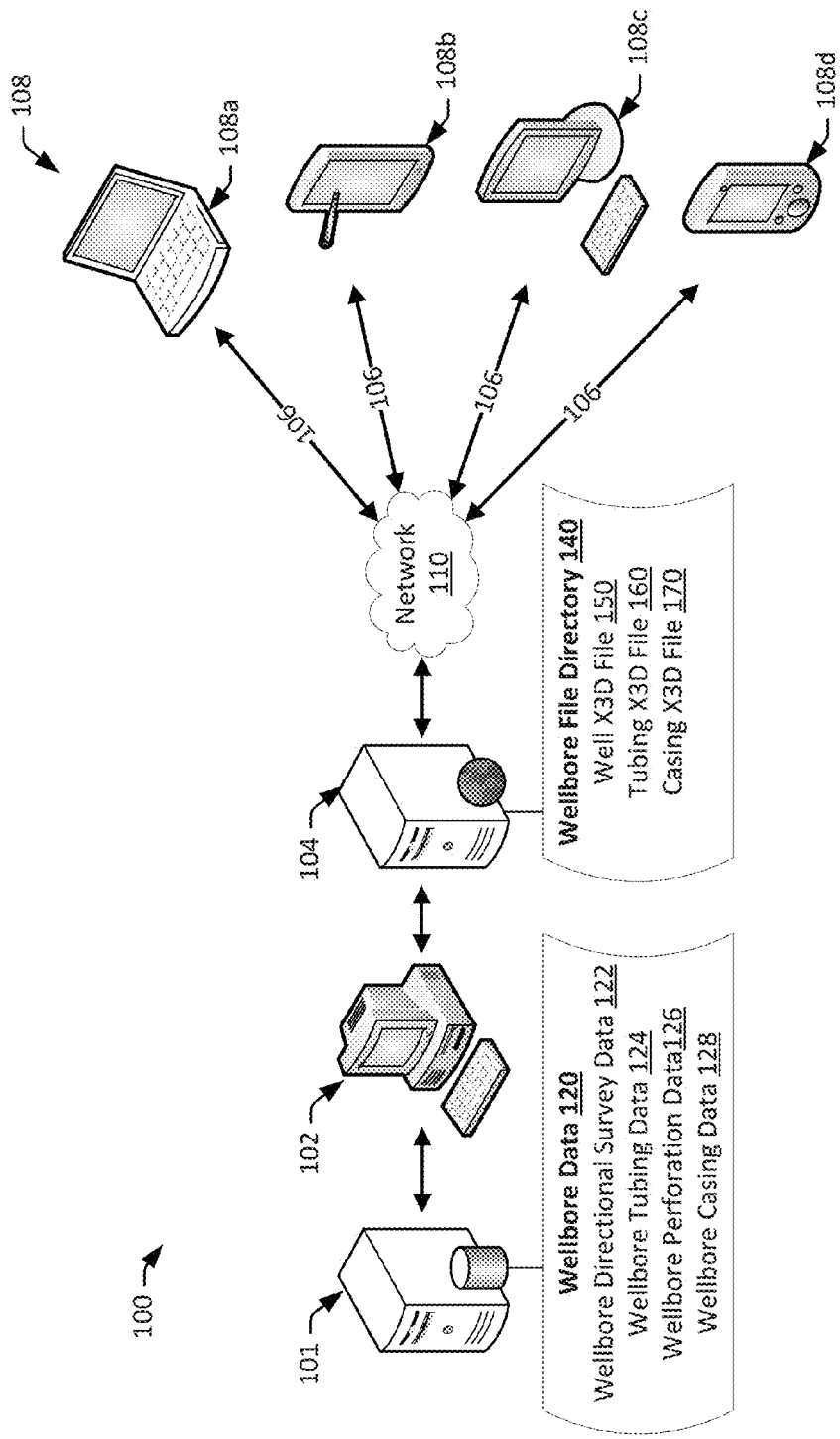
FIG. 1 is a schematic diagram that illustrates a well simulation system in accordance with one or more embodiments.

While this disclosure is susceptible to various modifications and alternative forms, specific embodiments thereof are shown by way of example in the drawings and will be described in detail herein. The drawings may not be to scale. It should be understood, however, that the drawings and the detailed descriptions thereto are not intended to limit the disclosure to the particular form disclosed, but, to the contrary, the intention is to cover all modifications, equivalents, and alternatives falling within the spirit and scope of the present disclosure as defined by the appended claims.

DETAILED DESCRIPTION

The present invention will now be described more fully hereinafter with reference to the accompanying drawings in which example embodiments of the invention are shown. This invention may, however, be embodied in many different forms and should not be construed as limited to the illustrated embodiments set forth herein, rather, these example embodiments are provided so that this disclosure will be thorough and complete, and will fully convey the scope of the invention to those skilled in the art.

Described herein are embodiments of three dimensional interactive wellbore model simulation systems and associated methods. In some embodiments, wellbore data (e.g., for a wellbore of an oil and gas well in an oil and gas reservoir) is obtained and processed to create a wellbore file directory that can be used to generate and display interactive models of the wellbore (also referred to as simulations of the wellbore). Display of such an interactive model may include, for example, a three-dimensional (3D) visualization of the wellbore trajectory (or path) and associated completion features, such as tubing paths, tubing perforation locations, casing paths and/or the like. In some embodiments, the wellbore directory for a well may include a well model file (e.g., well X3D files) that can be accessed and processed by a remote computing device, such as a tablet computer, for use in generating an interactive 3D model of the well. For example, an engineer may use his tablet computer to retrieve and view a 3D model of the well while working in the field. The model may be stored in a central location (e.g., a web server) and may be updated regularly such that users (e.g., engineers), can access current models remotely via a network device, such as via a workstation or a mobile network device (e.g., tablet computer, laptop computer, and/or the like).

In some embodiments, the wellbore data for a well includes wellbore directional survey data, wellbore tubing data, wellbore perforation data, wellbore casing data, and/or the like for each or one or more laterals (or sections) of the wellbore of the well. Thus, for example, if a well includes include a first lateral (e.g., a main wellbore) with two additional laterals (e.g., two wellbore laterals extending from the main wellbore), then the wellbore data for the well may include wellbore directional survey data, wellbore tubing data, wellbore perforation data, wellbore casing data, and/or the like for each of the three laterals. Although three laterals are described for the purpose of illustration, a well may include any suitable number of laterals.

The wellbore directional survey data may include, for example, for each lateral of the wellbore (e.g., for a main wellbore and each other lateral of the wellbore), a corresponding well name (e.g., a name of the well for which the wellbore is a part of), a lateral name (e.g., a name of the specific lateral of the overall wellbore, such as a name for the main wellbore, or the name of a lateral extending from the main wellbore), x-coordinates, y-coordinates, true vertical depths, and measured depths for a plurality of points (or locations) along the lateral. Thus, the wellbore directional survey data may be indicative of some or all of the trajectory (or path) of the wellbore, including some or all of the laterals of the wellbore.

The wellbore tubing data may include data that specifies the location and size of tubing in the wellbore. For example, the wellbore tubing data can include a well name, a lateral name, a tubing from-measured depth value, a tubing to-measured depth value, and a tubing size. For example, the wellbore tubing data may specify a well name of "well_1", a lateral name "A_50_0" a tubing size of 10 centimeters (cm) extending from a depth of 10 meters (m) to a depth of 2000 m, a tubing size of about 8 cm extending from a depth of 2000 m to a depth of 3000 m, and so forth. The wellbore tubing data may represent some or all of the lengths of the one or more laterals making up the wellbore, and, thus, may effectively represent the some or all of the wellbore trajectory (or path).

The wellbore perforation data may include data that specifies the location and size of perforations in the wellbore tubing. For example, the wellbore perforation data can include a well name, a lateral name, a perforation from-measured depth value, a perforation to-measured depth value, and a perforation size. For example, the wellbore perforation data may specify a well name of "well_1", a lateral name "A_50_0", a perforation size of 3 cm in a length of the wellbore tubing extending from a depth of 2000 m to a depth of 2100 m, a perforation size of about 1 cm in a length of the wellbore tubing extending from a depth of 3000 m to a depth of 3100 m, and so forth.

The wellbore casing data may include data that specifies the location and size of casing in the wellbore. For example, the wellbore casing data can include a well name, a lateral name, a casing from-measured depth value, a casing to-measured depth value, and casing size. For example, the wellbore casing data may specify a well name of "well_1", a lateral name "A_50_0", a casing size of 20 cm extending from a depth of 10 m to a depth of 2000 m, a casing size of about 25 cm extending from a depth of 20 m to a depth of 2400 m, and so forth.

In some embodiments, a wellbore file directory for a well includes a well extensible three dimensional (X3D) file, one or more tubing X3D files, one or more casing X3D files, and/or the like. An X3D file may include an International Organization for Standardization (ISO) Extensible Markup Language (XML)-based file format for representing 3D computer graphics. Such X3D files may be capable of being rendered by a variety of software applications, such as web-browser applications or the like. Such an application may utilize an X3D plug-in for generating 3D interactive graphical user interfaces (GUIs) for displaying the contents of the X3D files. As described herein, the contents of the X3D files may be rendered (e.g., by a web-browser application and X3D plug-in of a remote computing device) to provide for the display of an interactive 3D model simulating a wellbore of a well, and associated features, such as the trajectory (or path) of the wellbore, and the location of tubing, tubing perforations, casing and/or the like. A well X3D file for a well may include animation elements, viewpoint elements, and links (e.g., URL tags) corresponding wellbore tubing X3D files, wellbore casing X3D files, grid files and/or the like for the well. A wellbore tubing X3D file may include tubing data and perforation data defining one or more virtual tubing paths for the wellbore and the locations of perforations in the tubing, including the corresponding sizes for the tuning and perforations along the virtual tubing paths. A wellbore casing X3D file may include casing data defining one or more virtual casing paths for the wellbore, including the corresponding sizes for the casing along the virtual casing paths.

In some embodiments, features of each lateral of a well are used to generate a corresponding well model for the well. Such a process can be repeated for any number of wells to generate well models for a plurality of wells. For example, if a field includes three wells, a modeling process consistent with that described herein can be conducted for each of the three wells to generate a separate well model for each of the three wells of the field.

In some embodiments, for each lateral of a well, one or more features representative of the trajectory (or path) of the lateral is created using the wellbore directional survey data for the lateral. For example, a GIS linear feature may be generated having vertices that intersects some or all of the points for a lateral defined by the X and Y coordinates, measured depth and/or true vertical depth. Thus, for example, if the wellbore directional survey data for a well defines ten points along the "A_50_0" lateral of the well, the GIS linear features may include a linear feature that intersects those ten points to represent the path of the main wellbore lateral. In such an embodiment, a first portion/segment of the GIS linear feature may extend from the first point to the second point, a second portion/segment of the GIS linear feature may extend from the second point to the third point, and so forth. In some embodiments, each of the portions/segments of the GIS feature may be represented by a straight line extending between consecutive pairs of the points/vertices. A similar process may be conducted for each lateral of the well to generate GIS features representing the trajectory of the well. For example, if the well includes two laterals extending from a main wellbore, then a similar process may be performed for the main wellbore and each of the two laterals of the well. As a result, the wellbore trajectory of each well may be represented by one or more GIS lines, each representing a respective portion of the wellbore (e.g., a wellbore of a well being represented by a main wellbore GIS line representing the main wellbore lateral, and a plurality of lateral wellbore GIS lines extending from the main wellbore GIS line, each representing a respective lateral).

In some embodiments, for each lateral of the well having tubing data associated therewith, one or more events representative of the tubing of the lateral is created using the wellbore tubing data for the wellbore. For example, a GIS tubing event may be generated for each of the tubing to-measured depth and tubing from-measured depth, including an indication of the tubing size for the section extending between the two depths. For example, if the wellbore tubing data specifies a well name of "well_1", a lateral name of "A_50_0", and a tubing size of 10 cm extending from a depth of 1000 m to a depth of 2000 m, then a GIS tubing event may be generated indicating a diameter of 10 cm from 1000 m to 2000 m. In some embodiments, for each GIS tubing event, an X3D extrusion element is employed to generate a corresponding X3D cross-section that extends along the path (or spine) of the corresponding portion of the GIS linear feature representing that portion of the lateral. The cross-section may include a full-tubular cross-section having a circular shape that extends along the corresponding path to create a generally cylindrical shape along the path, thereby representing the section tubing along that portion of the wellbore. Continuing with the above example, an X3D extrusion operation may be performed to generate an X3D cross-section (e.g., named "well_1:A_50_0") having a diameter of about 10 cm extending from about 1000 m to about 2000 m, along the corresponding section of the GIS linear feature for the "A_50_0" lateral. Corresponding X3D appearance and animation tags can also be generated for the element. This can be repeated for each lateral of the well to generate a complete, seamless tubular wellbore trajectory for the well. Each of the extruded elements for the laterals of the well, and associated X3D appearance and animation tags for the element, can be exported to a respective wellbore tubing X3D files. Continuing with the above example, the extruded element for the "A_50_0" lateral of the "well_1" well, may be exported to a wellbore tubing X3D file named "TB well_1:A_50_0.x3d". A similar process may be conducted for each lateral of the well to create one or more wellbore tubing X3D files representing the tubing of the well.

In some embodiments, for each lateral of the well having casing data associated therewith, one or more elements representative of the casing of the lateral is created using the wellbore casing data for the wellbore. For example, for each casing section, a seamless half-section GIS "multi-patch" cylinder object may be generated from the casing from-measured depth to the casing to-measured depth, having a size that corresponds to the size of the casing for the section. The cross-section may include a partial-tubular cross-section having a semi-circular shape that extends along the corresponding path to create a generally semi-cylindrical shape along the path, thereby representing the section of casing along that portion of the wellbore. In the resulting 3D simulation display of the model, the semi-circular shape may enable viewing of internal elements of the wellbore, such as tubing that is located within the casing. The GIS "multi-patch" cylinder object may, be converted to an X3D "IndexedTriangleStripSet" element. Associated X3D appearance and animation tags for the X3D "IndexedTriangleStripSet", and a casing size anchored text element can also be generated for the element. The X3D "IndexedTriangleStripSet" element, the casing size anchored text element, and associated X3D appearance and animation tags for the X3D "IndexedTriangleStripSet" element, can be exported to respective X3D casing wellbore file. Continuing with the above example, if the wellbore tubing data specifies a well name of "well_1", a lateral name of "A_50_0", and a casing size of 40 cm extending from a depth of 0 m to a depth of 100 m, then a GIS "multi-patch" cylinder object may be generated from the casing from-measured depth to the casing to-measured depth, having a radius of about 20 cm (or diameter of about 40 cm); the GIS "multi-patch" cylinder object may, be converted to an X3D "IndexedTriangleStripSet" element; and the X3D "IndexedTriangleStripSet" element, a casing size anchored text element of "40 cm", and associated X3d appearance and animation tags for the X3D "IndexedTriangleStripSet" element, may be exported to a wellbore casing X3D file named "CSG_well_1:A_50_0.x3d". A similar process may be conducted for each lateral of the well to create one or more wellbore casing X3D files representing the casing of the well.

In some embodiments, a model file is created for the well. The model for a well may include a well X3D file that includes inline uniform resource locator (URL) links (e.g., URL tags) that reference the wellbore tubing X3D file(s) for the well and/or the wellbore casing X3D file(s) for the well. The links can be used, for example, by a browser of a remote computing device to navigate to the information associated with the URL. The well X3D file may also include additional information for modeling the well, such as URL links that reference respective X, Y and Z grid files that can be used to generate a 3D grid that surrounds the 3D wellbore profile in the resulting interactive 3D model of the well. The well X3D file may also include, for example, transformation and navigation elements that can be used by an X3D plug-in of an internet browser to display the visualization of a 3D model on a GUI, and enable the user to interact with the displayed 3D model (e.g., rotate the viewing angle of the model, and/or the like). Continuing with the above example for "well_1", a well X3D file named "well_1.x3d" may be created that includes a URL link to the wellbore tubing X3D file named "TB well_1:A_50_0.x3d" and URL links to the other wellbore tubing X3D files for the well (e.g., that can be used by an X3D plug-in of an internet browser to generate a tubing portion of the simulation of the 3D model of the well), a URL link to the wellbore casing X3D file named "CSG_well_1:A_50_0.x3d" and URL links to the other wellbore casing X3D files for the well (e.g., that can be used by an X3D plug-in of an internet browser to generate a casing portion of the simulation of the 3D model of the well), a URL link to each of respective X, Y and Z grid files (e.g., that can be used to generate a 3D grid that surrounds the 3D wellbore profile in the simulation of the 3D model of the well), and transformation and navigation elements (e.g., that can be used by an X3D plug-in of an internet browser to display the 3D model on a GUI, and enable the user to interact with the 3D model (e.g., rotate the viewing angle of the model, and the like)). The above process described for a well can be repeated to generate well models for a plurality of wells. For example, where a field includes three wells, the above process can be conducted for each of the three wells to generate a separate well X3D file for each of the wells of the field.

In some embodiments, the well models (e.g., the well X3D files) and the linked-to files (e.g., the wellbore tubing X3D files, the wellbore casing X3D files, and X, Y and Z grid files linked to by the well X3D files) can be stored in a central location, such as a network server. Such an arrangement may enable the well models to be accessed (e.g., via HTTPS protocol) via a plurality of remote devices, such as workstations in offices throughout a facility or mobile devices used by engineers in the field, that have the application software (e.g., a web browser and an X3D web browser plug-in) for viewing the well models. Continuing with the above example, the three well X3D files maybe stored, for example, on an organization's web server. Employees within the organization may be able to access and view the well models on a workstation computer device in her/his office or on a mobile computer device (e.g., a laptop computer, a tablet computer, a mobile smart phone, or the like), using a web browser application running an X3D plug-in for accessing X3D files and rendering the corresponding interactive simulations of the 3D models on a display of the device. Moreover, such an arrangement may enable for simplified updating of well models and deployment thereof to ensure that those viewing the well models are provided with up-to-date information. For example, the above processes for generating well models for one or more of the wells of a field of wells may be run on a regular basis (e.g., hourly, daily, weekly, monthly, or the like) to generate updated/current X3D files for the wells (e.g., the well X3D files, and the wellbore tubing X3D files, the wellbore casing X3D files, and X, Y and Z grid files linked to by the well X3D files) that are stored in the central location. Thus, the well models may reflect the latest information for the well.

In some embodiments, a well X3D file may be associated with a well location displayed on a map, and a user can access the simulation of the 3D model for the well by simply selecting the location. For example, a field of wells may be displayed on a user's remote computer device, such as a laptop computer. Each of the wells may have a corresponding well X3D file that is linked, or otherwise associated with the location of the well on the map. Upon the user selecting the location of the well on the map, the remote computer device may query a web server for the well X3D file for that well. The web server may provide the well X3D file to the remote computing device, and the remote computing device may render the 3D model of the well using the data in the well X3D file, including querying the web server for the data for the tubing and casing data of the tubing and casing X3D files using the links to the tubing and casing X3D files, and rendering the tubing and casing data of the tubing and casing X3D files.

According to some embodiments, a method to generate a wellbore file directory and simulate three-dimensional interactive wellbore models can include selecting a well, and then selecting a lateral associated with the well. The method further can include reading wellbore directional survey data associated with the selected lateral. The wellbore directional survey data can include a lateral name and information associated with a plurality of vertices associated with the selected lateral. For example, each vertex can include an x-coordinate, y-coordinate, true vertical depth, and a measured depth. The method further can include creating one or more multi-point GIS linear features along a GIS virtual wellbore path. The GIS virtual wellbore path can approximate an actual wellbore path for the selected lateral, and each multi-point GIS linear feature can include one or more of the plurality of vertices associated with the lateral.

According to embodiments, the method further can include opening a tubing X3D file, which will form a first component of a wellbore file directory and be used to transform tubing and perforation data into a virtual tubing path and virtual perforation path respectively. After setting scene appearance tags for the selected lateral in the tubing X3D file, the method can include reading wellbore tubing data for the selected lateral. The wellbore tubing data can include a tubing from-measured depth value, tubing to-measured depth value, and tubing size. In addition, the method can include reading wellbore perforation data for the selected lateral. The wellbore perforation data can include a perforation from-measured depth value, perforation to-measured depth value, and perforation size. Responsive to reading the wellbore tubing data, the method can include identifying tubing sections of the one or more GIS linear features between the tubing from-measured depth value and the tubing to-measured value for the wellbore tubing. In addition, responsive to reading the wellbore perforation data, the method can include identifying perforation sections of the one or more GIS linear features between the perforation from-measured depth value and the perforation to-measured depth value for the wellbore perforation. The X3D elements direction and orientation for the tubing and perforation linear features will be determined by the section of the virtual wellbore path located along the linear features' measured depth values.

According to embodiments, the method can include constructing X3D cross-sections along the identified tubing sections in order to generate a virtual tubing path and constructing X3D cross-sections along the identified perforation sections in order to generate a virtual perforation path. A determination can be made whether the wellbore tubing data and the wellbore perforation data represent the respective final wellbore tubing and wellbore perforation record. If not, the method can include repeating the steps above related to reading tubing and perforation data, identifying tubing and perforation sections between respective from-measured depth value and to-measured depth values, and constructing X3D cross-sections along the identified tubing sections and identified perforation sections. This can ensure that virtual tubing paths and virtual perforation paths are constructed for each tubing section and perforation section for which data is available. If the wellbore tubing data and the wellbore perforation data do correspond to a final wellbore tubing and wellbore perforation record, however, the method can include setting animation tags for the tubing X3D file. The method further can include closing the tubing X3D file, thereby to create a first file of a wellbore file directory. It will be understood by one skilled in the art that the operations described herein with respect to a computer-implemented method can be carried out by executing instructions stored in one or more dedicated operational modules stored in a tangible computer-readable medium. For example, the requisite instructions can be stored in a tubing path generation module.

In embodiments, the method further can include steps to generate a virtual casing path. For example, the method can include opening a casing X3D file for the selected lateral and reading wellbore casing data for the selected lateral. The wellbore casing data can include casing from-measured depth, casing to-measured depth, and casing size. The method can include identifying sections of the one or more GIS linear features between the casing from-measured depth value and the casing to-measured depth value for the wellbore casing. Responsive to identifying these casing sections, the method can include constructing a half-section GIS multi-patch cylinder along the casing sections and constructing an X3D Index-Triangle-StripSet element from the half-section GIS multi-patch cylinder. Anchored text elements can be added to the identified casing sections. The anchored text elements can represent, for example, casing size.

A determination can be made whether the wellbore casing data corresponds to a final wellbore casing record. If not, and additional casing records exist, the method can include repeating the steps described herein for additional casing records. For example, the method can include reading casing data, constructing a half-section GIS multi-patch cylinder, constructing an X3D Index-Triangle-StripSet element, and adding anchored text elements for each additional wellbore casing record. If the wellbore casing data corresponds to the final wellbore casing record, the method can include setting animation tags for the casing X3D file and closing the casing X3D file, thereby creating a second file of the wellbore file directory. A determination can be made whether the selected lateral is the final lateral of the selected well for which data is available. If not, the method can include selecting additional laterals and repeating the requisite steps for each additional lateral to create additional tubing X3D files and additional casing X3D files for each lateral associated with the selected well. As with creating tubing X3D files, it will be understood by one skilled in the art that the operations described to create casing X3D files can be performed when the instructions of a dedicated module are executed. For example, a casing path generation module can store the instructions to generate a casing X3D file.

In embodiments, if it is determined that the selected lateral is the final lateral associated with the selected well, a well X3D file can be opened for the selected well. According to embodiments, scene viewpoint animations can be set for the well X3D file and uniform resource locator (URL) links can be created to link the well X3D file for the selected well to the tubing X3D files and casing X3D files associated with the selected well. Additional URL links can be created to link three-dimensional X, Y, Z, grids to link grids to the well X3D file. In addition, the well X3D file for the selected well can be linked to a well layer GIS web service, thereby allowing web access to the well X3D file. Then, a determination can be made whether the selected well is a final well for which wellbore directional survey data is available. If not, an additional well can be selected, and so on until well X3D files are created for each well for which wellbore directional survey data is available.

In embodiments, the well X3D file for the selected well can be accessed from a remote computing device with an Internet browser having an X3D plugin. The resulting simulation of a three-dimensional interactive wellbore model can occur client-side without the need for processor-intensive simulation software.

FIG. 1 is a schematic diagram that illustrates a well simulation system 100 in accordance with one or more embodiments. In some embodiments, the well simulation system 100 includes a database server 101, a workstation 102, a web server 104, and/or one or more remote computing devices 108 (e.g., a laptop computer 108a, a tablet computer 108b, a personal computer 108c, a smartphone 108d and/or the like). In some embodiments, the database server 101, the workstation 102, the web server 104, and/or remote computing devices 108 may be communicatively coupled via the same network or two or more different networks. For example, the database server 101, the workstation 102, and the web server 104 may be communicatively coupled via a first network, such as an organizations internal computer network or the Internet. The network may include, for example, a local area network (LAN), a wide area network (WAN), and/or the like. The network may be a private or public network. The network may be a wired or wireless network. The web server 104 and the remote devices 108 may be communicatively coupled via a second network 110, such as the Internet or the organizations internal computer network. The network 110 may include, for example, a local area network (LAN), a wide area network (WAN), the Internet and/or the like. The network 110 may be a private or public network. The network 110 may be a wired or wireless network. The network 110 may include secure connections 106 between the web server 104 and the remote devices 108. In some embodiments, some or all of the database server 101, the workstation 102, the web server 104 and/or the remote computing devices 108 may include a computer system that is the same or similar to that of the example computer system 1000 described with regard to FIG. 9.

The database server 101 may include a data store storing some or all of wellbore data 120. Although a single database server 101 is described in certain embodiments for the purpose of illustration, the database server 101 may include one or more database servers, such as a server farm. Although a single web server 104 is described in certain embodiments for the purpose of illustration, the web server 104 may include one or more web servers, such as a server farm. Although a single workstation 102 is described in certain embodiments for the purpose of illustration, the workstation 102 may include one or more workstations. Moreover, although certain embodiments describe certain operations being conducted by certain entities of the system 100, embodiments may include operations being performed by any suitable entity. For example, one or more servers may perform the operations described herein with regard to the database server 101, the workstation 102, and/or the web server 104.

Figure 2:
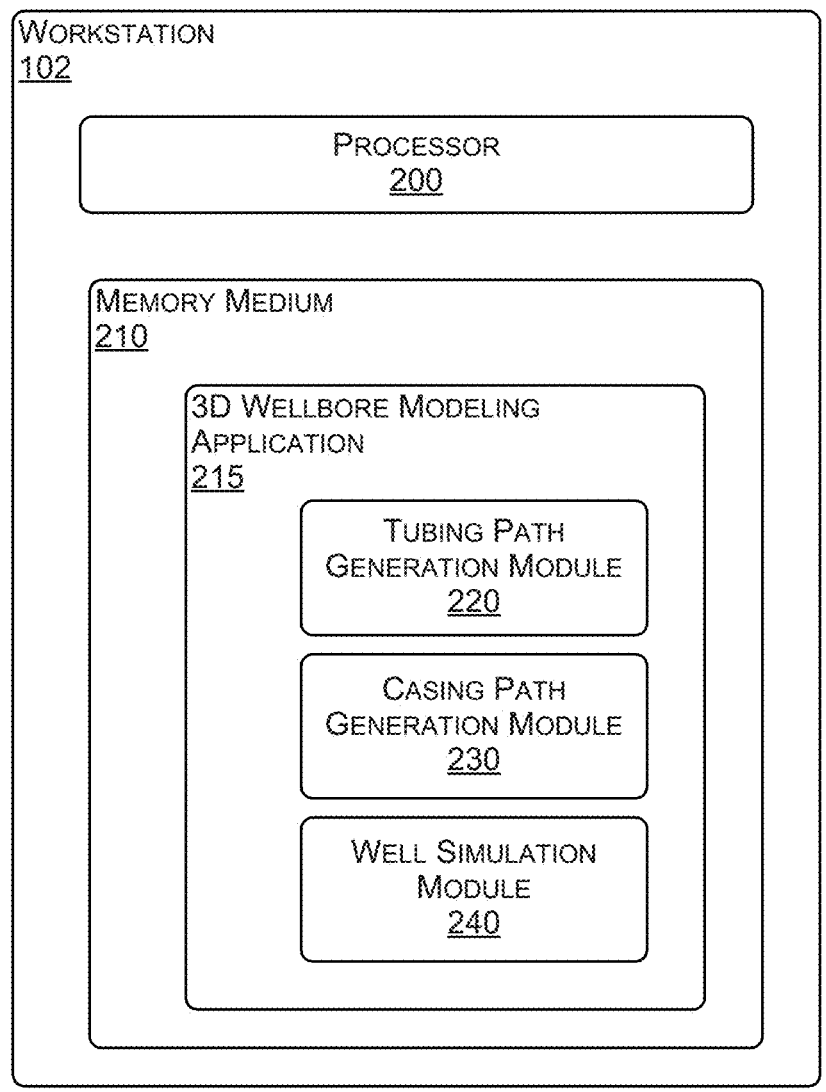
FIG. 2 is a schematic diagram that illustrates a workstation and associated components in accordance with one or more embodiments.
Figure 3:
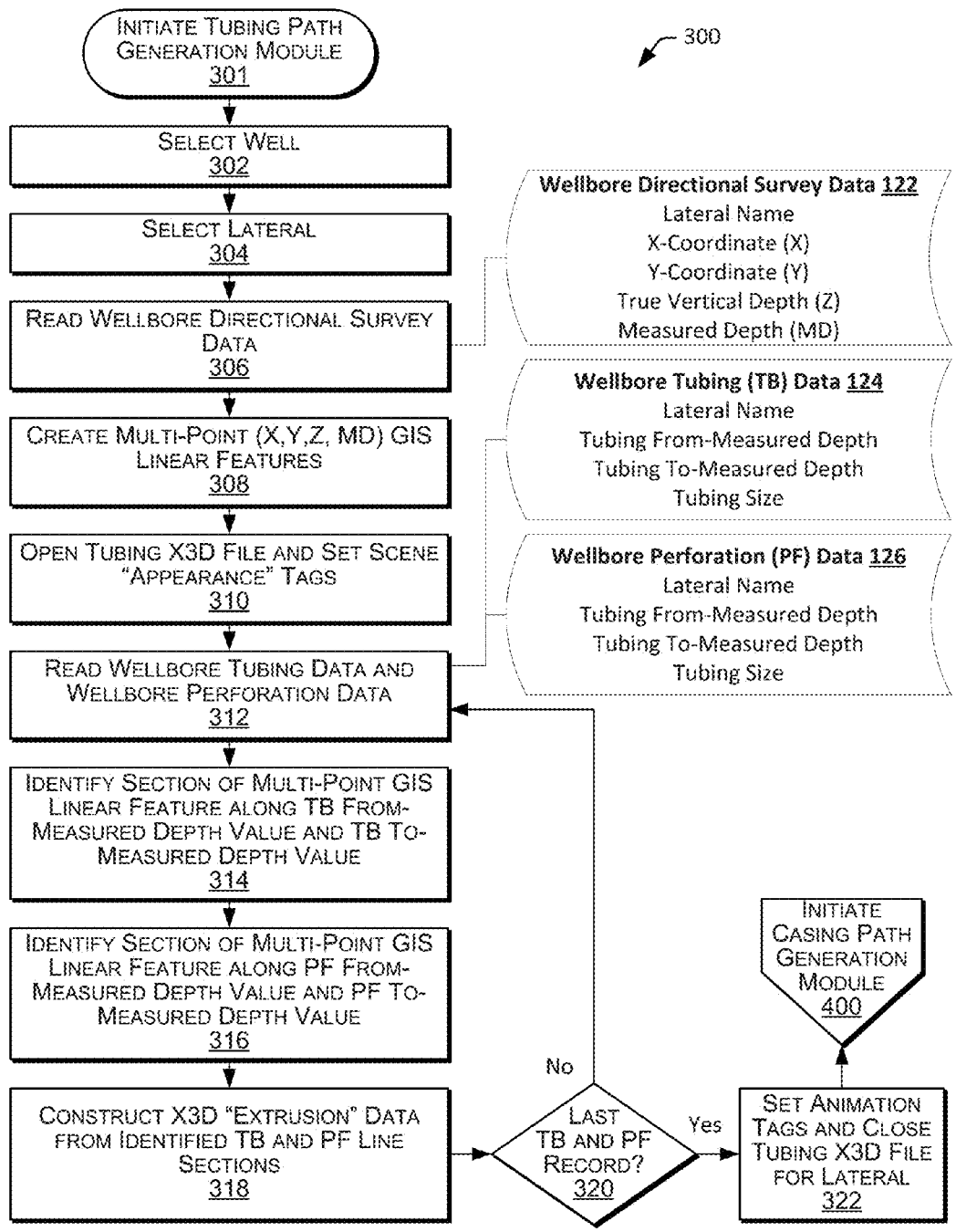
FIGS. 3-5 are flowcharts that illustrate a method for generating well models in accordance with one or more embodiments.
Figure 4:
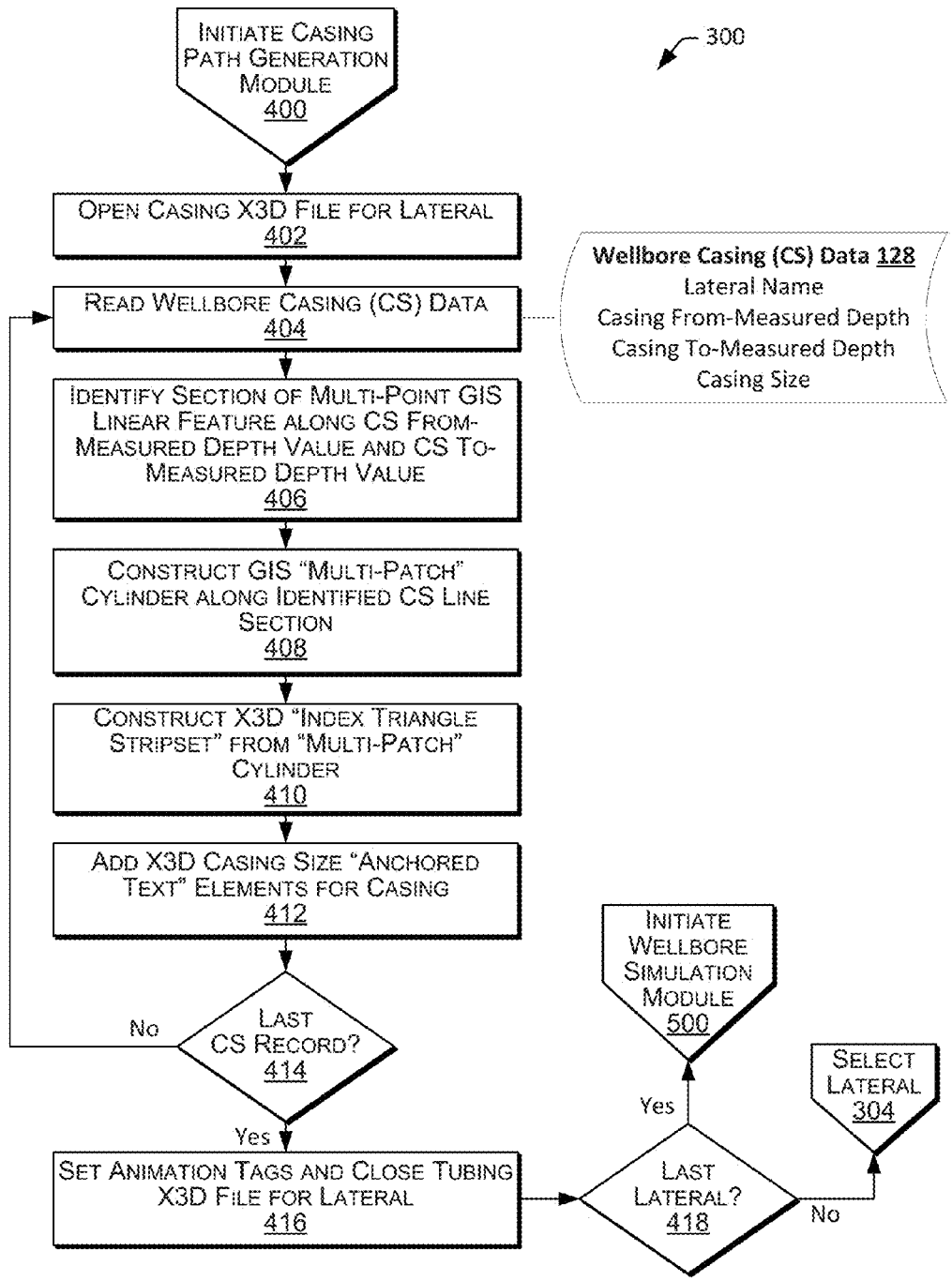
Figure 5:
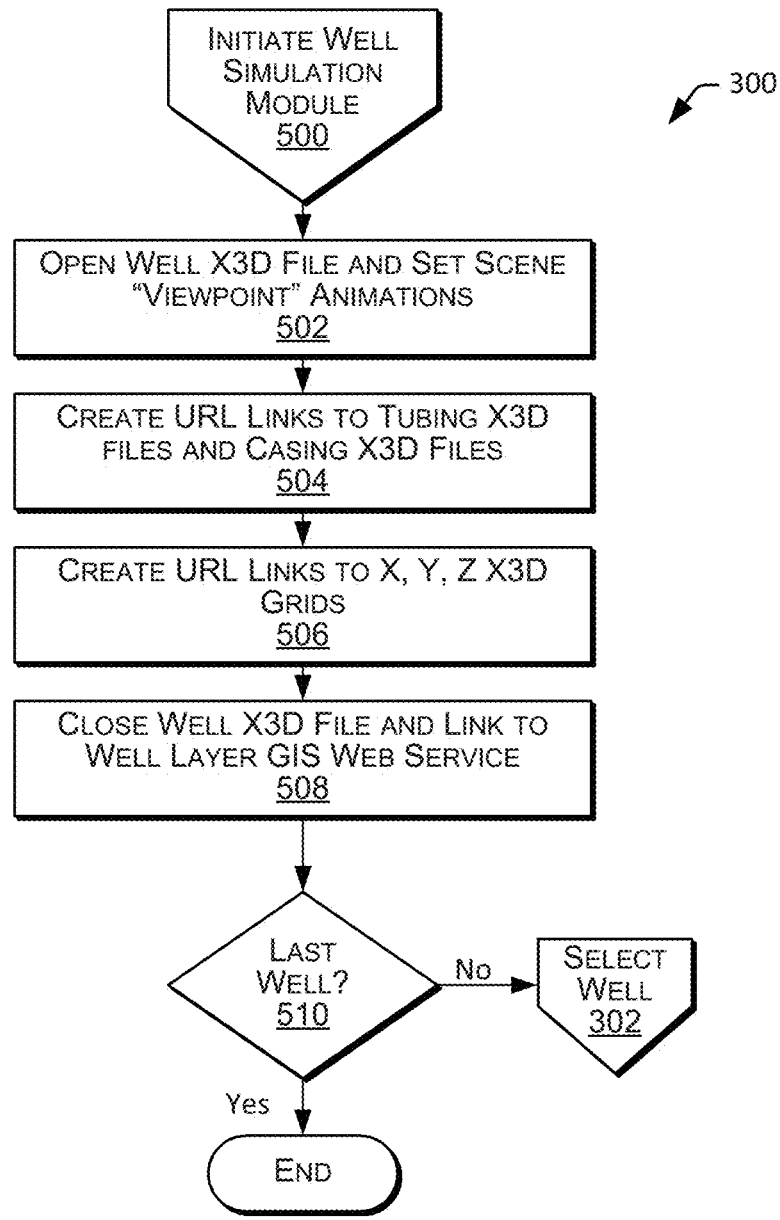

FIG. 2 is a schematic diagram that illustrates the workstation 102 and associated components in accordance with one or more embodiments. In some embodiments, the workstation 102 includes a processor 200 and a memory medium 210. The memory medium 210 may include a non-transitory computer readable storage medium having program instructions stored thereon that are executable by one or more processors (e.g., processor 200) to perform operations, such as those described herein with regard to the workstation 102. In some embodiments, the memory medium 210 has a 3D wellbore modeling application 215 stored thereon that is executable to perform some or all of the operations described herein with regard to the workstation 102. The 3D wellbore modeling application 215 may include one or more modules including subsets of the program instructions of the application 215 that are executable to perform certain operations. For example, the 3D wellbore modeling application 215 may include a tubing path generation module 220, a casing path generation module 230 and a well simulation module 240. Certain operations of the tubing path generation module 220 are described with regard to at least method 300 FIG. 3 and FIG. 6. Certain operations of the casing path generation module 230 are described with regard to at least method 400 FIG. 4 and FIG. 7. Certain operations of the well simulation module 240 are described with regard to at least method 500 FIG. 5 and FIG. 8. Notably, FIGS. 3-5 provide example flowcharts to illustrate how these operational modules provide for simulating interactive 3D wellbore models on the remote computing devices 108 by the transforming the wellbore data 120 using Geographic Information Systems (GIS) analytical functions.

Referring to FIG. 1, in some embodiments, the workstation 102 obtains wellbore data 120 for a well from the database server 101 and processes the obtained wellbore data 120 to generate corresponding files of a wellbore file directory 140 stored on the web server 104. The wellbore data 120 may include wellbore trajectory and completion information, such as wellbore directional survey data 122, wellbore tubing data 124, wellbore perforation data 126, wellbore casing data 128, and/or the like. The files of the wellbore file directory 140 may include a well X3D file 150 for the well, one or more tubing X3D files 160 for the well, one or more casing X3D files 170 for the well, and/or the like. As described herein, one or more of the files of the wellbore file directory 140 may be accessible by one or more of the remote computing devices 108 to provide for the display of the simulation of a 3D model of a well on a display screen thereof.

Wellbore data 120 can be collected via any suitable techniques, such as directional surveys. Directional surveys may include, for example, obtaining measurements needed to calculate and plot a 3D well path of a wellbore or a well. Instruments for conducting directional surveys can be set up in several different variations, depending on the intended use of the instruments and methods used to store or transmit survey information. Survey systems also are categorized by the methods used to transmit the data to the surface, such as wireline or measurement while drilling (MWD).

The wellbore directional survey data 122 may include, for example, for each lateral of a wellbore (e.g., for a main wellbore and each other lateral of the wellbore) of a well, the well name (e.g., a name of the well for which the wellbore is a part of), a lateral name (e.g., a name of the specific lateral of the overall wellbore, such as a name for the main wellbore, or the name of a lateral extending from the main wellbore), x-coordinates, y-coordinates, true vertical depths, and measured depths for a plurality of points or locations along the lateral. Thus, the wellbore directional survey data may be indicative of some or all of the trajectory (or path) of the wellbore, including some or all of the laterals of the wellbore.

The wellbore tubing data 124 may include data that specifies the location and size of tubing in the wellbore. For example, the wellbore tubing data 124 can include a well name, a lateral name, a tubing from-measured depth value, a tubing to-measured depth value, and a tubing size. For example, the wellbore tubing data may specify the well name of "well_1", a lateral name "A_50_0" a tubing size of 10 cm extending from a depth of 10 m to a depth of 2000 m, a tubing size of about 8 cm extending from a depth of 2000 m to a depth of 3000 m, and so forth. The wellbore tubing data 124 may represent some or all of the lengths of the one or more laterals making up the wellbore, and, thus, may effectively represent the some or all of the wellbore trajectory (or path).

The wellbore perforation data 126 may include data that specifies the location and size of perforations in the wellbore tubing. For example, the wellbore perforation data 126 can include a well name, a lateral name, a perforation from-measured depth value, a perforation to-measured depth value, and a perforation size. For example, the wellbore perforation data 126 may specify the well name of "well_1", a lateral name "A_50_0", a perforation size of 3 cm in a length of the wellbore tubing extending from a depth of 2000 m to a depth of 2100 m, a perforation size of about 1 cm in a length of the wellbore tubing extending from a depth of 3000 m to a depth of 3100 m, and so forth.

The wellbore casing data 128 may include data that specifies the location and size of casing in the wellbore. For example, the wellbore casing data 128 can include a well name, a lateral name, a casing from-measured depth value, a casing to-measured depth value, and casing size. For example, the wellbore casing data 128 may specify a well name of "well_1", a lateral name "A_50_0", a casing size of 20 cm extending from a depth of 10 m to a depth of 2000 m, a casing size of about 25 cm extending from a depth of 20 m to a depth of 2400 m, and so forth.

The tubing X3D file 160 can include tubing and perforation information as discussed herein and with regard to at least FIG. 3. The casing X3D file 170 can include casing information as discussed herein and with regard to at least FIG. 4. The well X3D file 150 can include animation elements, viewpoint elements, and URL links to the tubing X3D file 160 and casing X3D file 170 as discussed herein and with regard to at least FIG. 5.

The wellbore file directory 140 (and the files thereof) can be created or modified on workstation 102 and stored on the network server 104. The wellbore file directory 140 can be accessed via a secure connection by one or more of the remote computing devices 108. For example, the Hypertext Transfer Protocol Secure (HTTPS) protocol can be used to create a secure connection (e.g., via network 110) between network server 104 and one or more of the remote computing devices 108. According to embodiments of the, a wide range of hardware and software elements can be used to access the wellbore file directory 140. In some embodiments, as long as these remote computing devices 108a-d include web browsers with X3D plug-ins, the X3D files of the wellbore file directory 140 can be accessed and used to simulate, client-side, interactive 3D well models of wellbore directional survey data 122 (see e.g., 3D interactive wellbore simulation 800 of FIG. 8). Thus, for example, the laptop 108a, the tablet computer 108b, the personal computer 108c, and the smartphone 108d are example remote computing devices that can be used according to embodiments.

FIGS. 3-5 are flowcharts that illustrate a method 300 for generating well models for one or more wells in accordance with one or more embodiments. FIG. 3 is a flowchart that illustrates a portion of the method 300 for generating a virtual tubing path in accordance with one or more embodiments. Some or all of the operations described with regard to method 300 and FIG. 3 may be performed by the tubing path generation module 220, and may result in generation of a virtual tubing path (see, e.g., virtual tubing path 620 of FIG. 6) for a well, using wellbore tubing data 124 and wellbore perforation data 126 for the well.

As illustrated, in response to initiation of the tubing path generation module 220 (block 301), a well is selected (block 302) from one or more wells (e.g., from wells of a field of wells). The well can be selected, for example, according to the desktop application's internal logic. Then, a lateral of the selected well is selected (block 304) from one or more laterals of the selected well. As with selecting a well (block 302), selecting a lateral (block 304) can be an automated process, in which a lateral is selected according to the application's internal logic. For the selected lateral, wellbore directional survey data 122 is accessed (block 306). The wellbore directional survey data 122 can include, for example, lateral name, x-coordinate, y-coordinate, true vertical depth, and measured depth. The wellbore directional survey data 122 can be used to create a plurality of multi-point GIS linear features (block 308) along a GIS virtual wellbore path (see, e.g., GIS virtual wellbore path 600 of FIGS. 6-7). In this way, geographic location data can be stored as relative positions along measured GIS linear features, and distance measures can be used to locate events along the GIS linear features. Scene "appearance" tags can be set for the model in a tubing X3D file (block 310). Although, certain embodiments including use of the X3D file format, embodiments can include the use of any suitable format. Wellbore tubing data 124 and wellbore perforation data 126 can be accessed (block 312) to provide tubing and perforation information, respectively, for the selected lateral. Wellbore tubing data 124 and wellbore perforation data 126 are shown to be accessed together, although though in embodiments, one can be accessed without accessing the other.

The wellbore tubing data 124 can include the name of the selected lateral, a tubing from-measured depth, a tubing to-measured depth, and tubing size. The tubing from-measured depth value and the tubing to-measured depth value are treated as events along the GIS linear features. Similarly, the wellbore perforation data 126 can include the name of the selected lateral, a perforation from-measured depth, a perforation to-measured depth, and perforation size. As with the wellbore tubing data 124, the perforation from-measured depth value and the perforation to-measured depth value can be treated as events along the GIS linear features. Accessing the wellbore tubing data and wellbore perforation data 312 may allow identification of each section of the multi-point GIS linear features along the tubing from-measured depth value and the tubing to-measured depth value (block 314) as well as identification of each section of the multi-point GIS linear features along the perforation from-measured depth value and the perforation to-measured depth value (block 316). The X3D "Extrusion" element can be used to construct X3D "Extrusion" data from the identified tubing and perforation sections (block 318). In embodiments, this can include constructing X3D cross-sections along the identified tubing and perforation line sections. Constructing X3D "Extrusion" data along the identified section (block 318) can produce data representing a seamless tubular wellbore trajectory. After constructing X3D "Extrusion" data from the identified tubing and perforation sections (block 318), the same or similar operations may be performed for additional tubing and perforation sections of the selected lateral. A decision may be made as to whether the identified tubing and perforation line sections represent the last tubing and perforation record for the selected lateral (block 320). If not, then additional wellbore tubing and wellbore perforation data may be accessed (block 312); other sections of the multi-point GIS linear feature may be identified along the tubing from-measured depth value and the tubing to-measured depth value (block 314) and along the perforation from-measured depth value and the perforation to-measured depth value (block 316), and X3D "Extrusion" data may be constructed from these sections as well (block 318). When the last tubing and perforation record has been read, animation tags may be set and the tubing X3D file may be closed (block 322) for the selected lateral and the casing path generation module 230 may be initiated (block 400 of FIG. 4).

FIG. 4 is a flowchart that illustrates a portion of the method 300 for generating a virtual casing path in accordance with one or more embodiments. Some or all of the operations described with regard to method 300 and FIG. 4 may be performed by the casing path generation module 230, and may result in generation of a virtual casing path (see, e.g., virtual tubing path 620 of FIG. 6) for the well from wellbore casing data 128 for the well.

As illustrated, in response to initiation of the casing path generation module 230 (block 400), a casing X3D file for the selected lateral is opened (or created), and the wellbore casing data 128 for the selected lateral is accessed (block 404). The wellbore casing data 128 may include the name of the selected lateral, a casing from-measured depth, a casing to-measured depth, and casing size. The casing from-measured depth value and the casing to-measured depth value may be treated as events along the GIS linear features. Reading the casing data record (block 404) may allow identification of each section of the multi-point GIS linear features along the casing from-measured depth value and the casing to-measured depth value (block 406). For the identified sections of the selected lateral, a GIS "Multi-patch" cylinder may be constructed (block 408) using 3D GIS analytical operators. The GIS "Multi-patch" cylinder may be a smooth, seamless half-section (see, e.g., half-section 710 of FIG. 7). In other words, the GIS "Multi-patch" cylinder may be semi-cylindrical with respect to the GIS virtual wellbore path (see, e.g., virtual wellbore path 600), thus allowing a user to view both tubing information and casing information simultaneously when the client-side simulation of the resulting 3D model is presented. The GIS "Multi-patch" cylinder may be converted to an X3D "Index-Triangle-StripSet" element (block 410). The X3D triangular elements, or Triangulated Irregular Networks (TIN) X3D elements, may be effectively laid end-to-end to fit within the smooth, seamless, half-section (block 410). Anchored text elements can be added (block 412) as "tooltip" type interactive descriptions of various elements that are displayed or are dynamically displayed. For example, the "tooltip" type interactive descriptions of various elements may be displayed in response to a user hovering over a respective section of the simulation with a cursor or selecting a section. For example, a casing size description can be added as an X3D anchored text element (block 412). A decision may made as to whether the last casing record has been read (block 414). If not, then the operations of blocks 404 to 412 may be iteratively repeated for each additional casing record. If so, then animation tags may be set for the casing X3D file, and the file may be closed (block 416). A decision may, then, be made whether the wellbore directional survey data 122 has been accessed for each lateral of the well (block 418). If not, then the method 300 may return to selection of another/next lateral (block 304 of FIG. 3) and the operations of blocks 304 to 418 of FIGS. 3 and 4 may be repeated for the newly selected lateral. If it is determined that wellbore directional survey data 122 has been accessed for the last lateral (block 418), then the method may proceed to initiating the well simulation module (block 500).

FIG. 5 is a flowchart that illustrates a portion of the method 300 for generating a well model (e.g., including contents of a wellbore file directory 140) in accordance with one or more embodiments. Some or all of the operations described with regard to method 300 and FIG. 5 may be performed by the well simulation module 240, and may result in generation of a well model for the well, using the tubing X3D and casing X3d files generated for the well.

As illustrated, in response to initiation of the well simulation module 240 (block 500), a well X3D file 150 is opened (or created) for the selected well and "viewpoint" animations are set (block 502). Opening the well X3D file and setting "viewpoint" animations (block 502) facilitates viewing the completed simulation and enhances a user's ability to interact with the simulated wellbore model. In embodiments, inline URL links to the tubing X3D files 160 and casing X3D files 170 for the well are added to the well X3D file 150 (block 504). In embodiments, inline URL links to standard X, Y, Z grids may also be added to the well X3D file 150 (block 506). These inline URL links to standard X, Y, Z grids may facilitate viewing the completed simulation and help orient a user who is viewing the interactive wellbore model. The well X3D file 150 can be closed and linked to a well layer GIS web service (block 508). This may provide the remote computing devices 108 with access to the well X3D file 150 (and linked-to files). A decision may be made as to whether a well X3D file 150 has been created for every well of a plurality of wells of interest (e.g., for each well of a field and/or for which corresponding wellbore directional survey data 122 exists in the database 101) (block 510).

If not, then the method 300 may return to selection of another/next well (block 302 of FIG. 3) and the operations of blocks 302 to 508 of FIGS. 3 to 5 may be repeated for the newly selected well. If so, then generated set of 3D well profiles (e.g., the tubing X3D files 160, the casing X3D files 170, and the well X3D files 150 may be copied to the wellbore file directory 140 of the network server 104. The plurality of well X3D files 150 (referencing the casing X3D files 170 and the tubing X3D files 160), may be accessible via URL links through secure connections 106.

Figure 6:
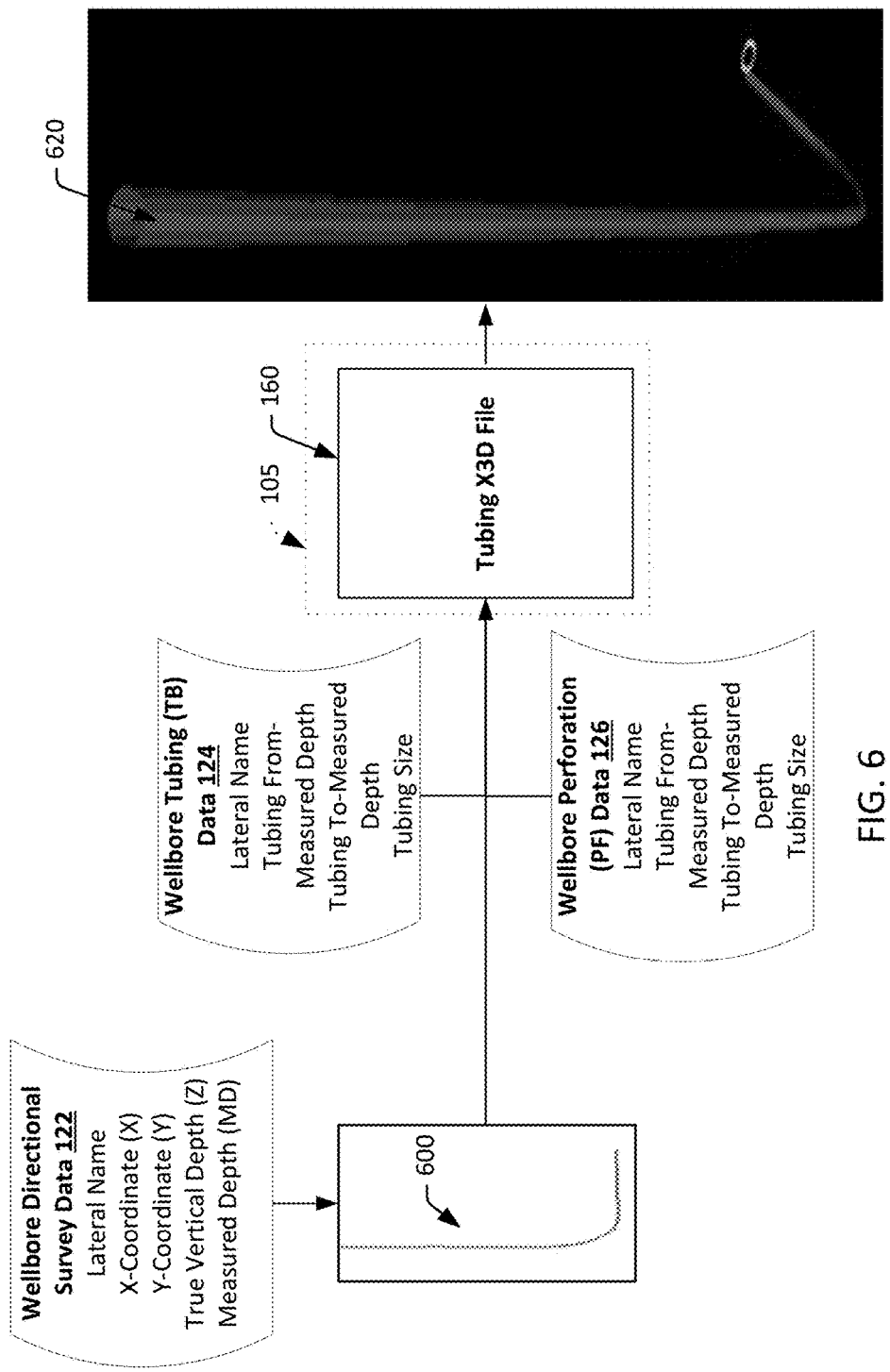
FIG. 6 is a schematic diagram that illustrates transformation of wellbore data into a tubing X3D file in accordance with one or more embodiments.
Figure 7:
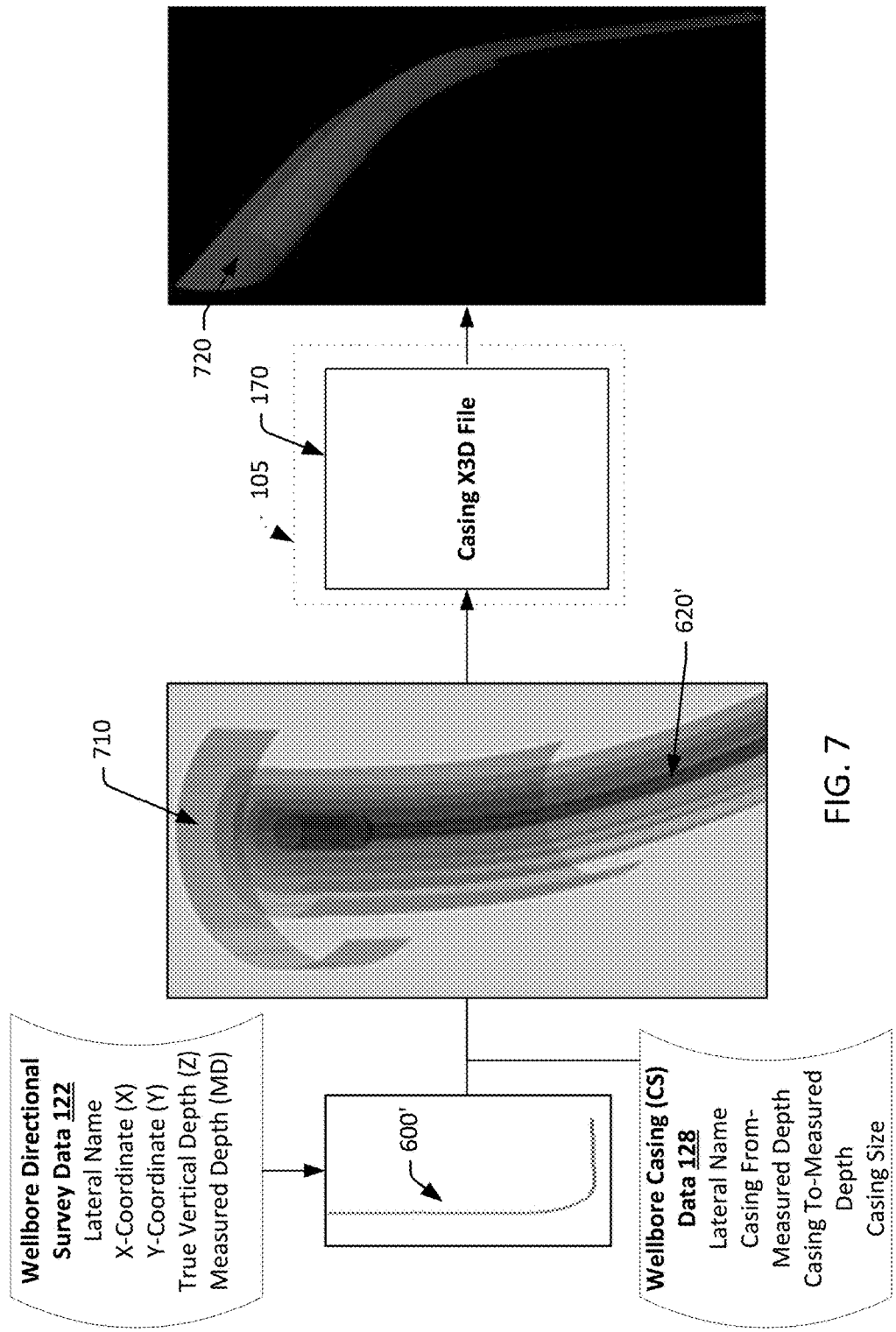
FIG. 7 is a schematic diagram that illustrates transformation of wellbore data into a casing X3D file in accordance with one or more embodiments.
Figure 8:
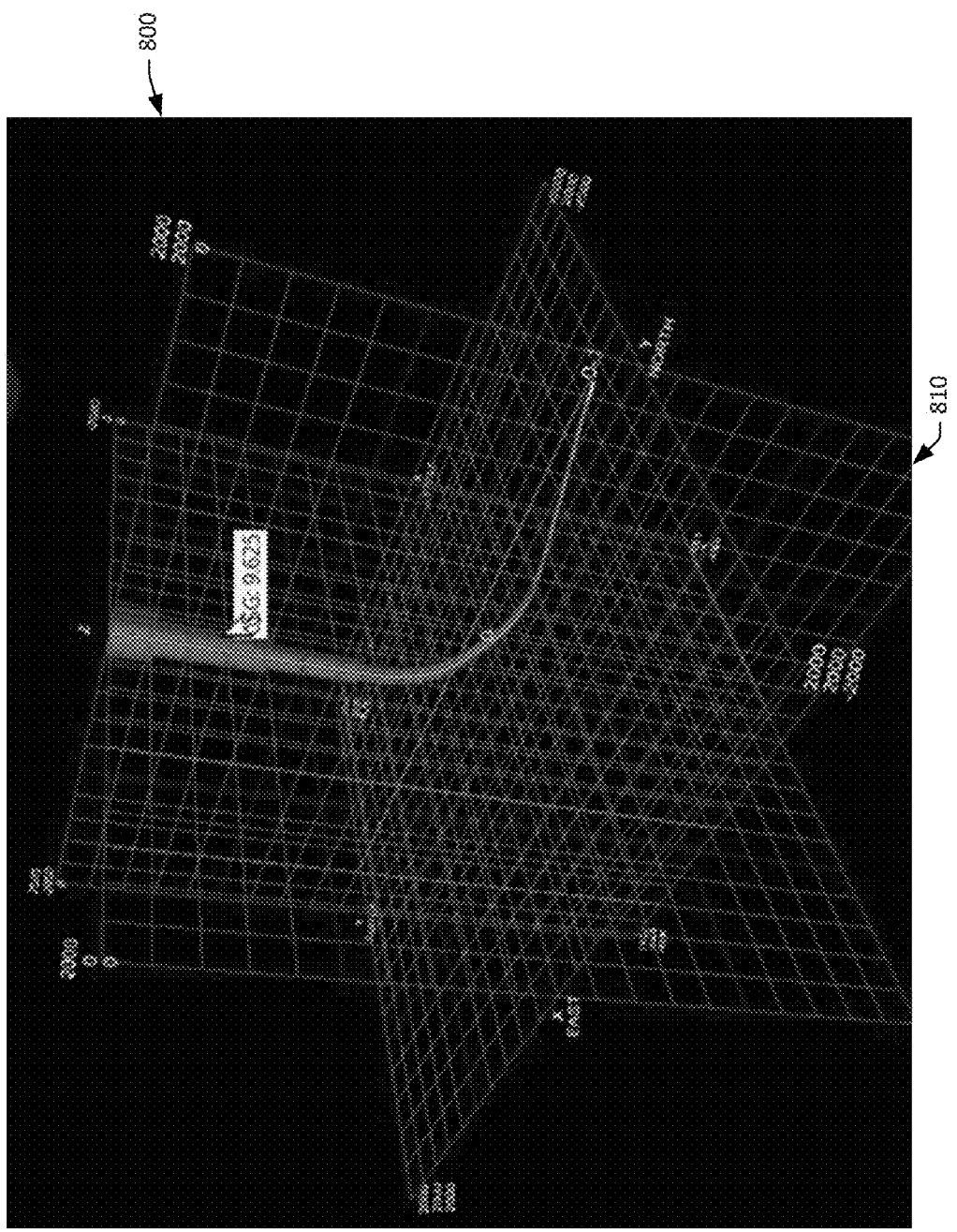
FIG. 8 is a screen-shot image that illustrates an interactive three-dimensional (3D) wellbore simulation in accordance with one or more embodiments.

FIGS. 6-8 illustrate various display elements of well models that may be visible to users of remote computing devices 108. FIG. 6 is a schematic diagram that illustrates transformation of wellbore data (e.g., wellbore directional survey data, wellbore tubing data, and wellbore perforation data) into a tubing X3D file in accordance with one or more embodiments.

FIG. 6 illustrates an X3D tubing path 620 constructed around a GIS virtual wellbore path 600. The GIS virtual wellbore path 600 may be constructed with wellbore directional survey data 122 as described herein. By accessing wellbore tubing data 124 and wellbore perforation data 126, sections of multi-point GIS linear features on the GIS virtual wellbore path 600 along tubing from-measured depth values and tubing to-measured depth values can be identified, for example, as discussed with regard to block 314 of FIG. 3. In addition, sections of multi-point GIS linear features on the GIS virtual wellbore path 600 along perforation from-measured depth values and perforation to-measured depth values can be identified, for example, as discussed with regard to block 316 of FIG. 3. X3D "Extrusion" data can be constructed from the identified tubing and perforation sections, for example, as discussed with regard to block 318 of FIG. 3 and animation tags can be set, and a resulting tubing X3D file 160 can be closed and stored in a wellbore file directory 140. The X3D tubing path 620 may be rendered client-side, for example, in a GUI displayed on a display screen of one or more remote computing devices 108. The X3D tubing path 620 may be rendered by accessing the tubing X3D file 160 via URL link through an X3D-enabled browser of one or more remote computing devices 108. For example, a well X3D file 150 created according to the operations described with regard to FIGS. 3-5 may include an inline URL link to the tubing X3D file 160.

FIG. 7 is a schematic diagram that illustrates transformation of wellbore data (e.g., wellbore directional survey data and wellbore casing data) into a casing X3D file in accordance with one or more embodiments. FIG. 7 illustrates an example X3D casing path 720 that may be constructed using the techniques described herein. For example, a GIS virtual wellbore path 600' can be constructed using wellbore directional survey data 122. Sections of multi-point GIS linear features on the GIS virtual wellbore path 600' along casing from-measured depth values and casing to-measured depth values can be identified using wellbore casing data 128, for example, as discussed with regard to step 406 of FIG. 4. A GIS Multi-patch half-cylinder 710 can be constructed around an X3D tubing path 620'. Using 3D GIS analytical operators, Triangulated Irregular Networks (TIN) X3D elements can be laid end to end to fit within the GIS Multi-patch half-cylinder 710 to remove distortions of the graphic feature in the run-time view environment. A resulting casing X3D file 170 may, then, be closed and stored in the wellbore file directory 140. The casing X3D file 170 may, then, be accessed via URL link through an X3D-enabled browser. The X3D casing path 720 may be rendered client-side, for example, in a GUI displayed on a display screen of one or more remote computing devices 108. The X3D casing path 720 may be rendered by accessing the casing X3D file 170 via URL link through an X3D-enabled browser of one or more remote computing devices 108. For example, a well X3D file 150 created according to the operations described with regard to FIGS. 3-5 may include an inline URL link to the casing X3D file 170.

FIG. 8 is a screen-shot image that illustrates an interactive three-dimensional (3D) wellbore model simulation (e.g., an exemplary user view of a completed 3D interactive wellbore simulation 800) in accordance with one or more embodiments. Such a 3D interactive wellbore simulation 800 may be viewed on a remote display, such as in a GUI displayed on a display of one or more of the remote computing devices 108. The completed 3D interactive wellbore simulation 800 may be rendered, for example, by accessing a corresponding well X3D file 150 via URL link through an X3D-enabled browser. As noted in reference to FIG. 5, the well X3D file 150 may include an inline URL link to an X, Y, Z grid 810 to facilitate viewing the simulation 800. Thus, the resulting simulation 800 of the wellbore may be oriented with respect to the superimposed grid 810. In addition, the completed simulation 800 can include the X3D tubing path 620, which represents the corresponding wellbore tubing data 124 and wellbore perforation data 126, and the X3D casing path 720, which represents the corresponding wellbore casing data 128. In some embodiments, the X3D tubing path 620 and X3D casing path 720 may be viewable separately. For example, the X3D tubing path 620 (including the representation of the tubing and/or perforations in the tubing) and/or X3D casing path 720 of a well model for a well may be "turned-off" in the viewing simulation of the well model. In addition, the wellbore tubing data 124, wellbore perforation data 126, and wellbore casing data 128 can be represented together, separately, or in various combinations, according to various embodiments.

Figure 9:
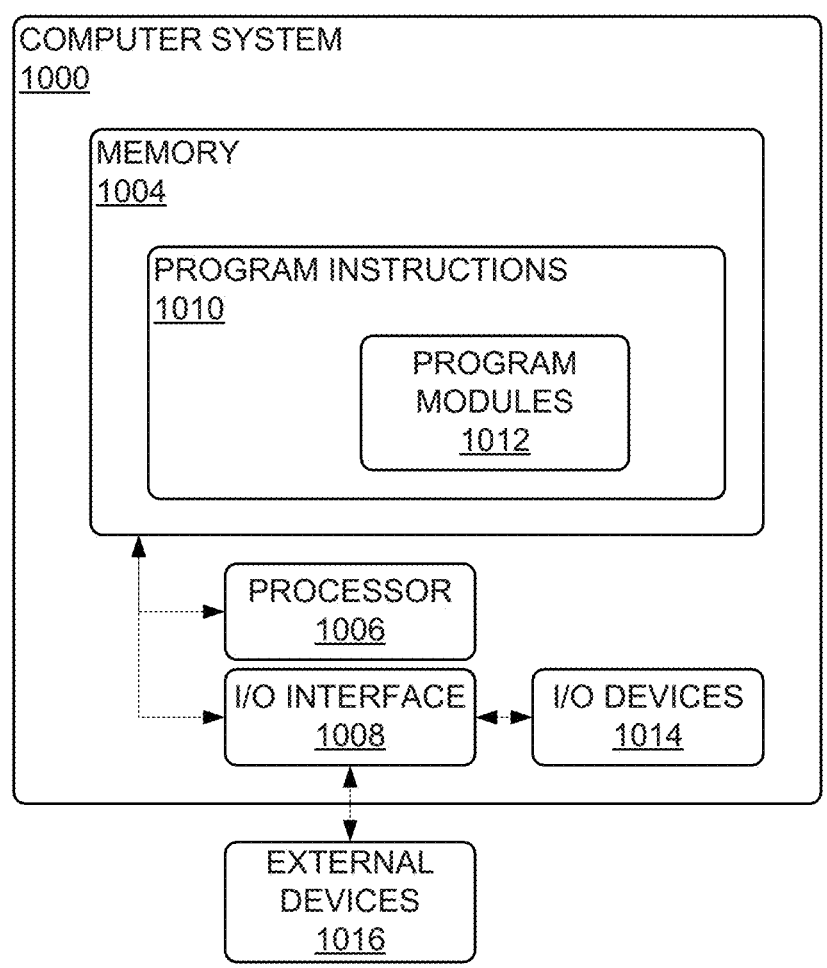
FIG. 9 is a diagram that illustrates an example computer system in accordance with one or more embodiments.

FIG. 9 is a diagram that illustrates an example computer system 1000 in accordance with one or more embodiments. The system 1000 may include a memory 1004, a processor 1006, and an input/output (I/O) interface 1008. The memory 1004 may include non-volatile memory (e.g., flash memory, read-only memory (ROM), programmable read-only memory (PROM), erasable programmable read-only memory (EPROM), electrically erasable programmable read-only memory (EEPROM)), volatile memory (e.g., random access memory (RAM), static random access memory (SRAM), synchronous dynamic RAM (SDRAM)), bulk storage memory (e.g., CD-ROM and/or DVD-ROM, hard drives), and/or the like. The memory 1004 may include a non-transitory computer-readable storage medium having program instructions 1010 stored therein. The program instructions 1010 may include program modules 1012 that are executable by a computer processor (e.g., the processor 1006) to cause the functional operations described herein.

As described above, In some embodiments, some or all of the database server 101, the workstation 102, the web server 104 and/or the remote computing devices 108 may include a computer system that is the same or similar to the that of computer system 1000. In an embodiment in which the database server 101 includes a computer system that is the same or similar to the that of computer system 1000, the program modules 1012 that are executable by a computer processor (e.g., the processor 1006) to cause the functional operations described herein with regard to the database server 101, such as operations regarding collecting and storing wellbore data 120. In an embodiment in which the workstation 102 includes a computer system that is the same or similar to the that of computer system 1000, the program modules 1012 that are executable by a computer processor (e.g., the processor 1006) to cause the functional operations described herein with regard to the workstation 102, such as those described with regard to generating a well model (e.g., the operations of method 300). In an embodiment in which the web server 104 includes a computer system that is the same or similar to the that of computer system 1000, the program modules 1012 that are executable by a computer processor (e.g., the processor 1006) to cause the functional operations described herein with regard to the web server 104, such as storing the wellbore file directory 140 and/or providing the remote devices 108 with access to the well X3D file 150 for a well, one or more tubing X3D files 160 for a well, one or more casing X3D files 170 for a well for use in rendering a 3D simulation of a well model for the well. In an embodiment in which a remote computing device 108 includes a computer system that is the same or similar to the that of computer system 1000, the program modules 1012 that are executable by a computer processor (e.g., the processor 1006) to cause the functional operations described herein with regard to the remote computing device 108, such as accessing to the well X3D file 150 for a well, one or more tubing X3D files 160 for the well, one or more casing X3D files 170 for the well and using the accessed files, and using the accessed data to render a simulation of a 3D well model for the well.

The processor 1006 may be any suitable processor capable of executing/performing program instructions. The processor 1006 may include a central processing unit (CPU) that carries out program instructions (e.g., the program instructions of the program module(s) 1012) to perform the arithmetical, logical, and input/output operations described herein. The processor 2006 may include one or more processors. The I/O interface 1008 may provide an interface for communication with one or more I/O devices 1014, such as a joystick, a computer mouse, a keyboard, a display screen (e.g., an electronic display for displaying a graphical user interface (GUI)), and/or the like. The I/O devices 1014 may include one or more of the user input devices. The I/O devices 1014 may be connected to the I/O interface 1008 via a wired (e.g., Industrial Ethernet) or a wireless (e.g., Wi-Fi) connection. The I/O interface 1008 may provide an interface for communication with one or more external devices 1016, such as other computers, networks, and/or the like. In some embodiments, the I/O interface 1008 may include an antenna, a transceiver, and/or the like. In some embodiments, the computer system 1000 and/or the external devices 1016 may include one or more sensors, and/or the like.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as examples of embodiments. Elements and materials may be substituted for those illustrated and described herein, parts and processes may be reversed or omitted, and certain features of the embodiments may be utilized independently, all as would be apparent to one skilled in the art after having the benefit of this description of the embodiments. Changes may be made in the elements described herein without departing from the spirit and scope of the embodiments as described in the following claims. Headings used herein are for organizational purposes only and are not meant to be used to limit the scope of the description.

It will be appreciated that the processes and methods described herein are example embodiments of processes and methods that may be employed in accordance with the techniques described herein. The processes and methods may be modified to facilitate variations of their implementation and use. The order of the processes and methods and the operations provided therein may be changed, and various elements may be added, reordered, combined, omitted, modified, etc. Portions of the processes and methods may be implemented in software, hardware, or a combination thereof. Some or all of the portions of the processes and methods may be implemented by one or more of the processors/modules/applications described herein.

As used throughout this application, the word "may" is used in a permissive sense (i.e., meaning having the potential to), rather than the mandatory sense (i.e., meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the phrase "based on" does not limit the associated operation to being solely based on a particular item. Thus, for example, processing "based on" data A may include processing based at least in part on data A and based at least in part on data B unless the content clearly indicates otherwise. As used throughout this application, the term "from" does not limit the associated operation to being directly from. Thus, for example, receiving an item "from" an entity may include receiving an item directly from the entity or indirectly from the entity (e.g., via an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A well simulation system, comprising:
one or more processors; and
non-transitory compute readable storage medium comprising program instructions stored thereon that are executable by the one or more processors to perform the following operations:
select a well comprising a wellbore having one or more laterals;
for each of the one or more laterals of the well:
obtain wellbore directional survey data for the lateral, the wellbore directional survey data identifying a path of the lateral;
generating, using the wellbore directional survey data for the lateral, a geographic information system (GIS) virtual wellbore path feature, the GIS virtual wellbore path feature comprising one or more multi-point GIS linear features corresponding to the path of the lateral;
obtain wellbore tubing data for the lateral, the wellbore tubing data for the lateral identifying size and location of one or more sections of wellbore tubing in the lateral;
obtain wellbore perforation data for the lateral, wellbore perforation data for the lateral identifying size and location of one or more sections of perforations in the lateral;
generate, using the wellbore tubing data and the wellbore perforation data for the lateral, an extensible three dimensional (X3D) virtual tubing path for the lateral, the X3D virtual tubing path for the lateral comprising:
one or more tubing X3D cross-sections corresponding to the size and location of the one or more sections of wellbore tubing in the lateral; and
one or more perforation X3D cross-sections corresponding to the size and location of the one or more sections of wellbore perforations in the lateral;
generate a tubing X3D file comprising data corresponding to the X3D virtual tubing path for the lateral;
obtain wellbore casing data for the lateral, wellbore casing data for the lateral identifying size and location of one or more sections of wellbore casing in the lateral;
generate, using the wellbore casing data for the lateral, an X3D virtual casing path for the lateral, the X3D virtual casing path for the lateral comprising an X3D element corresponding to the size and location of the one or more sections of wellbore casing in the lateral, wherein generating the X3D virtual casing path for the lateral comprises:
generating a seamless half-section GIS multi-patch cylinder object for each of the one or more sections of wellbore casing in the lateral; and
converting the seamless half-section GIS multi-patch cylinder object for each of the one or more sections of wellbore casing in the lateral to an X3D IndexedTriangleStripSet element; and
generate a casing X3D file comprising data corresponding to the X3D virtual casing path for the lateral;
generate a well X3D file for the well, the well X3D file comprising:
links to the tubing X3D files; and
links to the casing X3D files,
the well X3D file configured to be used by an X3D enabled application of one or more remote computing devices for use in generating a 3D simulation of the well for display on the one or more remote computing devices; and
provide, via a network, the well X3D file to an X3D enabled application of the one or more remote computing devices for use in generating a 3D simulation of the well for display on the one or more remote computing devices, the 3D simulation of the well comprising display of a 3D virtual tubing path corresponding to the X3D virtual tubing path that is generated using the links to the tubing X3D file and a 3D virtual casing path corresponding to the X3D virtual casing path that is generated using the links to the casing X3D file.

2. The system of claim 1, wherein generating the X3D virtual tubing path comprises:
performing an extrusion operation for each of the one or more sections of wellbore tubing in the lateral to generate the tubing X3D cross-sections corresponding to the size and the location of the one or more sections of wellbore tubing in the lateral; and
performing an extrusion operation for each of the one or more sections of wellbore perforations in the lateral to generate the perforation X3D cross-sections corresponding to the size and the location of the one or more sections of wellbore perforations in the lateral.

3. The system of claim 2,
wherein the wellbore tubing data for the lateral comprises, for each of the one or more sections of wellbore tubing in the lateral:
a tubing from-measured depth value;
a tubing to-measured depth value; and
a tubing size, and
wherein performing an extrusion operation for each of the one or more sections of wellbore tubing in the lateral to generate the tubing X3D cross-sections corresponding to the size and the location of the one or more sections of wellbore tubing in the lateral comprises, for each of the one or more sections of wellbore tubing, performing an extrusion operation between the tubing from-measured depth value for the section of wellbore tubing and the tubing to-measured depth value of the section of wellbore tubing, the extrusion having a size corresponding to the tubing size for the section of wellbore tubing;
wherein the wellbore perforation data for the lateral comprises, for each of the one or more sections of wellbore perforations in the lateral:
a perforation from-measured depth value;
a perforation to-measured depth value; and
a perforation size, and
wherein performing an extrusion operation for each of the one or more sections of wellbore perforations in the lateral to generate the one or more perforation X3D cross-sections corresponding to the size and the location of the one or more section of wellbore perforations in the lateral comprises, for each of the one or more sections of wellbore perforations, performing an extrusion operation between the perforation from-measured depth value for the section of wellbore perforations and the perforation to-measured depth value of the section of wellbore perforations, the extrusion having features indicative of the perforation size for the section of wellbore perforations.

4. The system of claim 1, wherein the wellbore casing data for the lateral comprises, for each of the one or more sections of wellbore casing in the lateral:
   a casing from-measured depth value;
   a casing to-measured depth value; and
   a casing size, and
   wherein generating a seamless half-section GIS multi-patch cylinder object for each of the one or more sections of wellbore casing in the lateral comprises generating for each of the one or more sections of wellbore casing, a seamless half-section GIS multi-patch cylinder object between the casing from-measured depth value for the section of wellbore casing and the casing to-measured depth value of the section of wellbore casing, the seamless half-section GIS multi-patch cylinder object having a size corresponding to the casing size for the section of wellbore casing.

5. The system of claim 1, wherein the well X3D file comprises links to X, Y and Z X3D grids for use in generating display of a 3D grid in the 3D simulation of the well.

6. The system of claim 1, wherein the links to the tubing X3D file comprise a URL link to the tubing X3D file, and wherein the links to the casing X3D file comprise a URL link to the casing X3D file.

7. The system of claim 1, wherein the system comprises:
   a database server storing wellbore data, the wellbore data comprising:
      the wellbore directional survey data for the one or more laterals of the well;
      the wellbore tubing data for the one or more laterals of the well;
      the wellbore perforation data for the one or more laterals of the well; and
      the wellbore casing data for the one or more laterals of the well,
      wherein the wellbore tubing data, the wellbore tubing data and the wellbore casing data for the one or more laterals of the well are obtained from the database server, and
   a web server communicatively coupled to one or more remote computing devices via a network, and comprises a wellbore file directory comprising:
      the well X3D file for the well;
      the tubing X3D files for the well; and
      the casing X3D files for the well,
      wherein the wellbore file directory is accessible by an X3D enabled application of the one or more remote computing devices via a network.

8. The system of claim 1, further comprising at least one of the one or more remote computing devices, wherein the at least of the one or more remote computing devices comprises an Internet browser application and an X3D plug-in for the Internet browser application, and wherein the at least of the one or more remote computing devices is configured to:
   access the well X3D file for the well;
   access, via the links to the tubing X3D files of the well X3D file, the data corresponding to the X3D virtual tubing path for the lateral of the tubing X3D file for the well;
   access, via the links to the casing X3D files of the well X3D file, the data corresponding to the X3D virtual casing path for the lateral of the casing X3D file for the well; and
   render the data corresponding to the X3D virtual tubing path for the laterals and the data corresponding to the X3D virtual casing path for the laterals to generate a display of a 3D model simulating the well on a display of the at least one of the one or more remote computing devices.

9. A method of simulating a well, the comprising:
selecting a well comprising a wellbore having one or more laterals;
for each of the one or more laterals of the well:
   obtaining wellbore directional survey data for the lateral, the wellbore directional survey data identifying a path of the lateral;
   generating, using the wellbore directional survey data for the lateral, a geographic information system (GIS) virtual wellbore path feature, the GIS virtual wellbore path feature comprising one or more multi-point GIS linear features corresponding to the path of the lateral;
   obtaining wellbore tubing data for the lateral, the wellbore tubing data for the lateral identifying size and location of one or more sections of wellbore tubing in the lateral;
   obtaining wellbore perforation data for the lateral, wellbore perforation data for the lateral identifying size and location of one or more sections of perforations in the lateral;
   generating, using the wellbore tubing data and the wellbore perforation data for the lateral, an extensible three dimensional (X3D) virtual tubing path for the lateral, the X3D virtual tubing path for the lateral comprising:
      one or more tubing X3D cross-sections corresponding to the size and location of the one or more sections of wellbore tubing in the lateral; and
      one or more perforation X3D cross-sections corresponding to the size and location of the one or more sections of wellbore perforations in the lateral;
   generating a tubing X3D file comprising data corresponding to the X3D virtual tubing path for the lateral;
   obtaining wellbore casing data for the lateral, wellbore casing data for the lateral identifying size and location of one or more sections of wellbore casing in the lateral;
   generating, using the wellbore casing data for the lateral, an X3D virtual casing path for the lateral, the X3D virtual casing path for the lateral comprising an X3D element corresponding to the size and location of the one or more sections of wellbore casing in the lateral, wherein generating the X3D virtual casing path for the lateral comprises:
      generating a seamless half-section GIS multi-patch cylinder object for each of the one or more sections of wellbore casing in the lateral; and
      converting the seamless half-section GIS multi-patch cylinder object for each of the one or more sections of wellbore casing in the lateral to an X3D IndexedTriangleStripSet element; and
   generating a casing X3D file comprising data corresponding to the X3D virtual casing path for the lateral;

generating a well X3D file for the well, the well X3D file comprising:
  links to the tubing X3D files; and
  links to the casing X3D files,
    the well X3D file configured to be used by an X3D enabled application of one or more remote computing devices for use in generating a 3D simulation of the well for display on the one or more remote computing devices; and
providing, via a network, the well X3D file to an X3D enabled application of the one or more remote computing devices for use in generating a 3D simulation of the well for display on the one or more remote computing devices, the 3D simulation of the well comprising display of a 3D virtual tubing path corresponding to the X3D virtual tubing path that is generated using the links to the tubing X3D files and a 3D virtual casing path corresponding to the X3D virtual casing path that is generated using the links to the casing X3D files.

10. The method of claim 9, wherein generating the X3D virtual tubing path comprises:
  performing an extrusion operation for each of the one or more sections of wellbore tubing in the lateral to generate the tubing X3D cross-sections corresponding to the size and the location of the one or more sections of wellbore tubing in the lateral; and
  performing an extrusion operation for each of the one or more sections of wellbore perforations in the lateral to generate the perforation X3D cross-sections corresponding to the size and the location of the one or more sections of wellbore perforations in the lateral.

11. The method of claim 10,
wherein the wellbore tubing data for the lateral comprises, for each of the one or more sections of wellbore tubing in the lateral:
  a tubing from-measured depth value;
  a tubing to-measured depth value; and
  a tubing size, and
wherein performing an extrusion operation for each of the one or more sections of wellbore tubing in the lateral to generate the tubing X3D cross-sections corresponding to the size and the location of the one or more sections of wellbore tubing in the lateral comprises, for each of the one or more sections of wellbore tubing, performing an extrusion operation between the tubing from-measured depth value for the section of wellbore tubing and the tubing to-measured depth value of the section of wellbore tubing, the extrusion having a size corresponding to the tubing size for the section of wellbore tubing;
wherein the wellbore perforation data for the lateral comprises, for each of the one or more sections of wellbore perforations in the lateral:
  a perforation from-measured depth value;
  a perforation to-measured depth value; and
  a perforation size, and
wherein performing an extrusion operation for each of the one or more sections of wellbore perforations in the lateral to generate the one or more perforation X3D cross-sections corresponding to the size and the location of the one or more section of wellbore perforations in the lateral comprises, for each of the one or more sections of wellbore perforations, performing an extrusion operation between the perforation from-measured depth value for the section of wellbore perforations and the perforation to-measured depth value of the section of wellbore perforations, the extrusion having features indicative of the perforation size for the section of wellbore perforations.

12. The method of claim 9, wherein the wellbore casing data for the lateral comprises, for each of the one or more sections of wellbore casing in the lateral:
  a casing from-measured depth value;
  a casing to-measured depth value; and
  a casing size, and
wherein generating a seamless half-section GIS multi-patch cylinder object for each of the one or more sections of wellbore casing in the lateral comprises generating for each of the one or more sections of wellbore casing, a seamless half-section GIS multi-patch cylinder object between the casing from-measured depth value for the section of wellbore casing and the casing to-measured depth value of the section of wellbore casing, the seamless half-section GIS multi-patch cylinder object having a size corresponding to the casing size for the section of wellbore casing.

13. The method of claim 9, wherein the well X3D file comprises links to X, Y and Z X3D grids, and wherein the links to X, Y and Z X3D grids are accessible by the one or more remote computing devices for use in providing for display of a 3D grid in the 3D simulation of the well.

14. The method of claim 9, wherein the links to the tubing X3D file comprise a URL link to the tubing X3D file, and wherein the links to the casing X3D file comprise a URL link to the casing X3D file.

15. The method of claim 9, wherein the method comprises:
  storing wellbore data, the wellbore data comprising:
    the wellbore directional survey data for the one or more laterals of the well;
    the wellbore tubing data for the one or more laterals of the well;
    the wellbore perforation data for the one or more laterals of the well; and
    the wellbore casing data for the one or more laterals of the well,
    wherein the wellbore tubing data, the wellbore perforation data and the wellbore casing data for the one or more laterals of the well are obtained from the database server, and
  generating a wellbore file directory comprising:
    the well X3D file for the well;
    the tubing X3D files for the well; and
    the casing X3D files for the well,
    wherein the wellbore file directory is accessible by an X3D enabled application of the one or more remote computing devices via a network.

16. The method of claim 9, comprising:
accessing the well X3D file for the well;
accessing, via the links to the tubing X3D files of the well X3D file, the data corresponding to the X3D virtual tubing path for the lateral of the tubing X3D file for the well;
accessing, via the links to the casing X3D files of the well X3D file, the data corresponding to the X3D virtual casing path for the lateral of the casing X3D file for the well; and
rendering the data corresponding to the X3D virtual tubing path for the lateral and the data corresponding to the X3D virtual casing path for the lateral to generate a display of a 3D model simulating the well on a display of at least one of the one or more remote computing devices.

17. A non-transitory computer readable medium comprising program instructions stored thereon for simulating a well, the program instructions executable by one or more computer processors to perform the following operations:

selecting a well comprising a wellbore having one or more laterals;

for each of the one or more laterals of the well:

obtaining wellbore directional survey data for the lateral, the wellbore directional survey data identifying a path of the lateral;

generating, using the wellbore directional survey data for the lateral, a geographic information system (GIS) virtual wellbore path feature, the GIS virtual wellbore path feature comprising one or more multi-point GIS linear features corresponding to the path of the lateral;

obtaining wellbore tubing data for the lateral, the wellbore tubing data for the lateral identifying size and location of one or more sections of wellbore tubing in the lateral;

obtaining wellbore perforation data for the lateral, wellbore perforation data for the lateral identifying size and location of one or more sections of perforations in the lateral;

generating, using the wellbore tubing data and the wellbore perforation data for the lateral, an extensible three dimensional (X3D) virtual tubing path for the lateral, the X3D virtual tubing path for the lateral comprising:

one or more tubing X3D cross-sections corresponding to the size and location of the one or more sections of wellbore tubing in the lateral; and one or more perforation X3D cross-sections corresponding to the size and location of the one or more sections of wellbore perforations in the lateral;

generating a tubing X3D file comprising data corresponding to the X3D virtual tubing path for the lateral;

obtaining wellbore casing data for the lateral, wellbore casing data for the lateral identifying size and location of one or more sections of wellbore casing in the lateral;

generating, using the wellbore casing data for the lateral, an X3D virtual casing path for the lateral, the X3D virtual casing path for the lateral comprising an X3D element corresponding to the size and location of the one or more sections of wellbore casing in the lateral, wherein generating the X3D virtual casing path for the lateral comprises:

generating a seamless half-section GIS multi-patch cylinder object for each of the one or more sections of wellbore casing in the lateral; and converting the seamless half-section GIS multi-patch cylinder object for each of the one or more sections of wellbore casing in the lateral to an X3D IndexedTriangleStripSet element; and generating a casing X3D file comprising data corresponding to the X3D virtual casing path for the lateral;

generating a well X3D file for the well, the well X3D file comprising:

links to the tubing X3D files; and links to the casing X3D files, the well X3D file configured to be used by an X3D enabled application of one or more remote computing devices for use in generating a 3D simulation of the well for display on the one or more remote computing devices; and providing, via a network, the well X3D file to an X3D enabled application of the one or more remote computing devices for use in generating a 3D simulation of the well for display on the one or more remote computing devices, the 3D simulation of the well comprising display of a 3D virtual tubing path corresponding to the X3D virtual tubing path that is generated using the links to the tubing X3D files and a 3D virtual casing path corresponding to the X3D virtual casing path that is generated using the links to the casing X3D files.

* * * * *